US009293172B2

(12) United States Patent
Lee et al.

(10) Patent No.: US 9,293,172 B2
(45) Date of Patent: Mar. 22, 2016

(54) VERTICAL TYPE SEMICONDUCTOR DEVICE AND METHOD FOR MANUFACTURING THE SAME

(71) Applicants: Jae-Goo Lee, Hwaseong-si (KR); Jin-Soo Lim, Hwaseong-si (KR)

(72) Inventors: Jae-Goo Lee, Hwaseong-si (KR); Jin-Soo Lim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 15 days.

(21) Appl. No.: 13/865,580

(22) Filed: Apr. 18, 2013

(65) Prior Publication Data

US 2014/0021632 A1    Jan. 23, 2014

(30) Foreign Application Priority Data

Jul. 17, 2012 (KR) ........................ 10-2012-0077939

(51) Int. Cl.

| H01L 23/48 | (2006.01) |
|---|---|
| G11C 5/06 | (2006.01) |
| H01L 21/48 | (2006.01) |
| H01L 27/115 | (2006.01) |
| H01L 21/768 | (2006.01) |
| H01L 23/485 | (2006.01) |
| G11C 8/14 | (2006.01) |
| H01L 23/522 | (2006.01) |

(52) U.S. Cl.
CPC *G11C 5/063* (2013.01); *G11C 8/14* (2013.01); *H01L 21/486* (2013.01); *H01L 21/76816* (2013.01); *H01L 23/485* (2013.01); *H01L 27/11573* (2013.01); *H01L 27/11575* (2013.01); *H01L 23/5226* (2013.01); *H01L 27/11582* (2013.01); *H01L 2924/0002* (2013.01)

(58) Field of Classification Search
CPC ....................................................... G11C 5/063
USPC ............. 257/774, E21.21, E29.309; 438/639
See application file for complete search history.

(56) References Cited

U.S. PATENT DOCUMENTS

| 7,936,004 B2 | 5/2011 | Kito et al. |
|---|---|---|
| 2008/0029801 A1 | 2/2008 | Nakamura |
| 2008/0067583 A1 | 3/2008 | Kidoh et al. |
| 2008/0099819 A1 | 5/2008 | Kito et al. |
| 2009/0212350 A1* | 8/2009 | Kidoh et al. .................. 257/324 |
| 2009/0224309 A1 | 9/2009 | Kidoh et al. |
| 2010/0039865 A1* | 2/2010 | Kidoh et al. ............. 365/185.23 |
| 2010/0207195 A1 | 8/2010 | Fukuzumi et al. |
| 2010/0320526 A1 | 12/2010 | Kidoh et al. |
| 2011/0001178 A1 | 1/2011 | Iwase et al. |
| 2011/0013454 A1 | 1/2011 | Hishida et al. |
| 2011/0147818 A1 | 6/2011 | Katsumata et al. |
| 2011/0151667 A1* | 6/2011 | Hwang et al. ................. 438/667 |
| 2011/0316069 A1 | 12/2011 | Tanaka et al. |

* cited by examiner

*Primary Examiner* — Matthew Gordon
(74) *Attorney, Agent, or Firm* — F. Chau & Associates, LLC

(57) ABSTRACT

A vertical type semiconductor device includes a pillar structure protruding from a top surface of a substrate of a cell array region. Word lines extend while surrounding the pillar structure. Word line contacts contact edges of the word lines functioning as pad portions. An insulating interlayer pattern is provided on the substrate of a peripheral circuit region, which is disposed at an outer peripheral portion of the cell array region. A first contact plug contacts the substrate of the peripheral circuit region. A second contact plug contacts a top surface of the first contact plug and has a top surface aligned on the same plane with the top surfaces of the word line contacts. The first and second contact plugs are stacked in the peripheral circuit region, so the failure of the vertical type semiconductor device is reduced.

20 Claims, 39 Drawing Sheets

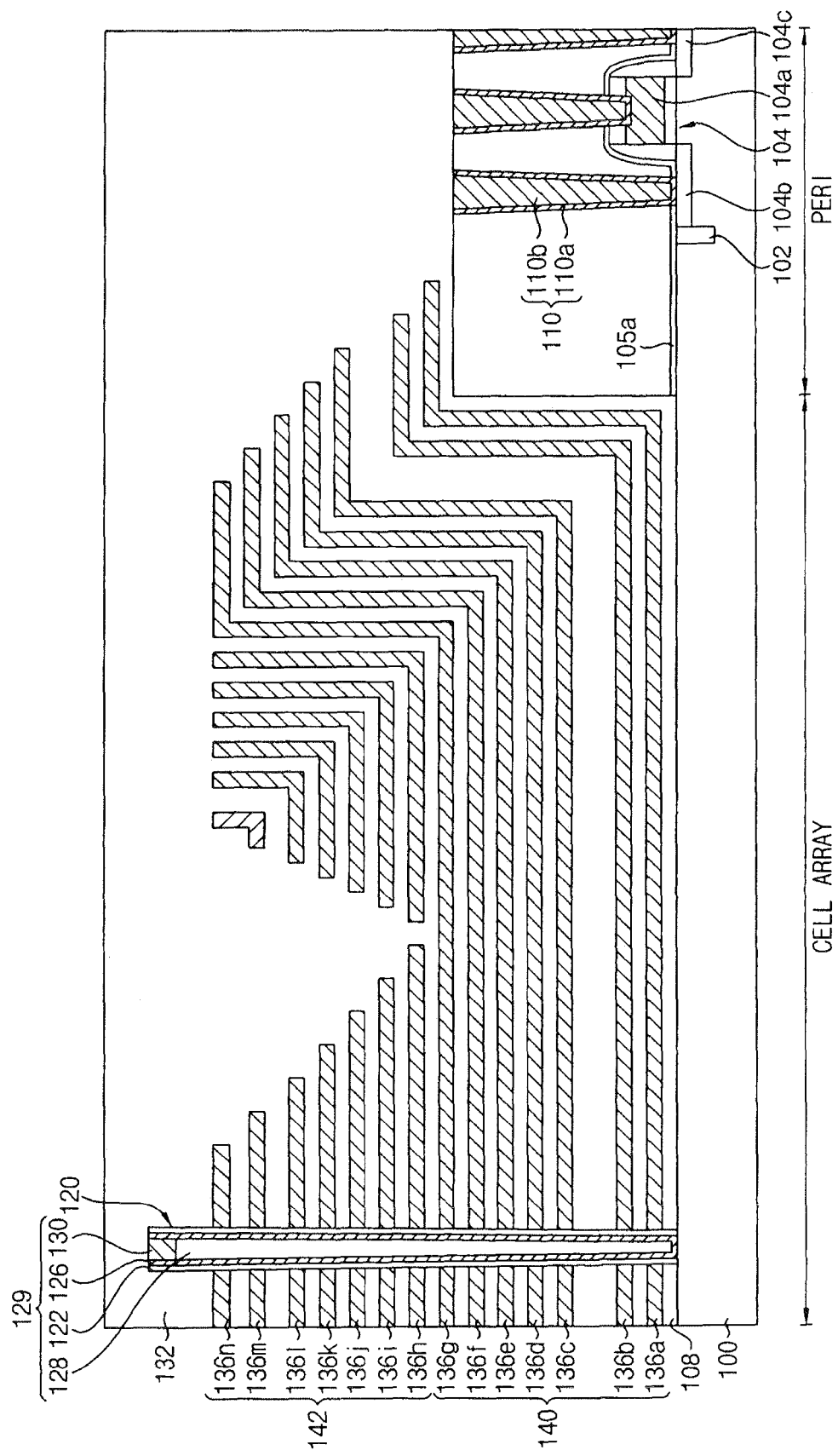

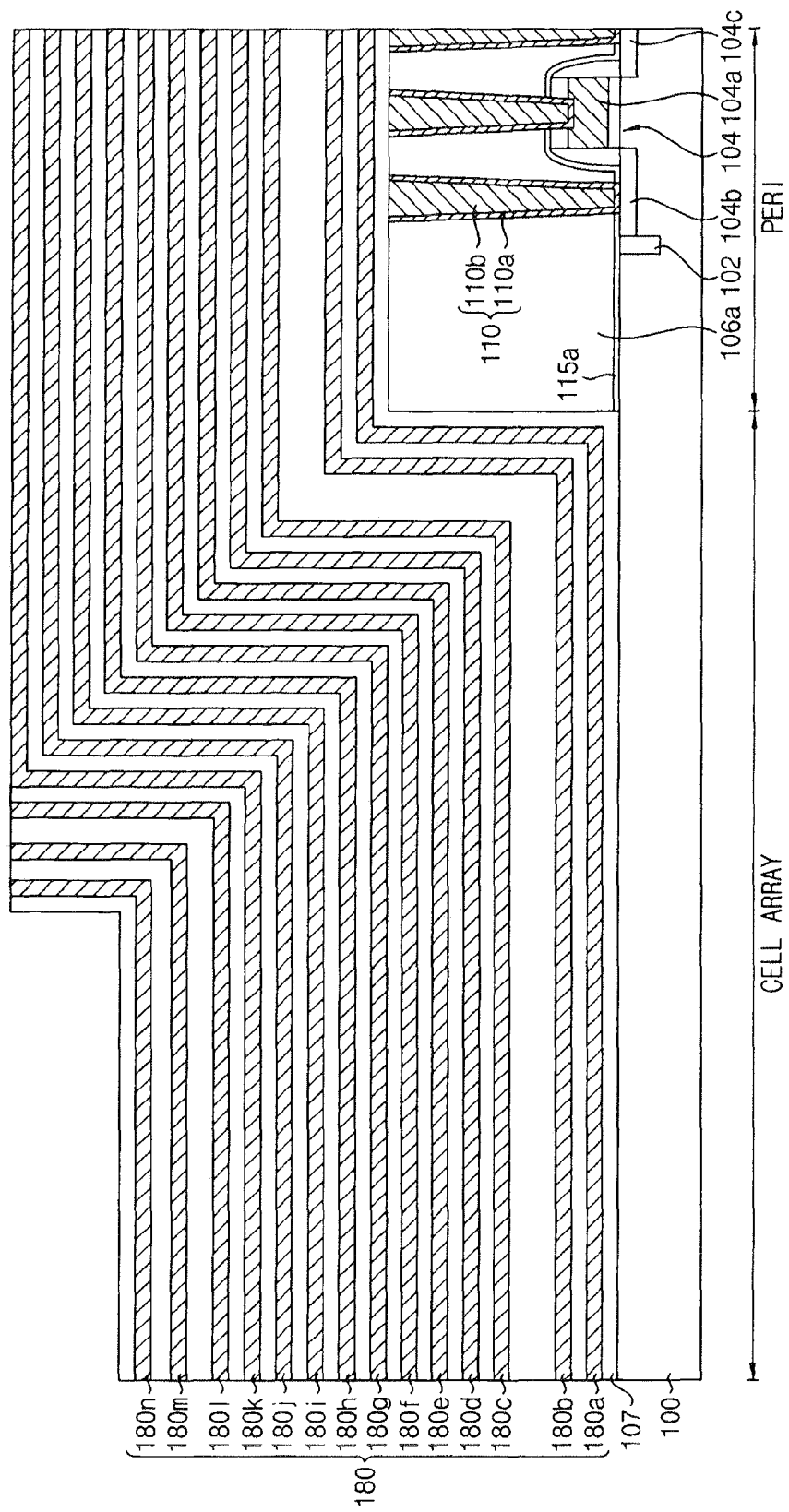

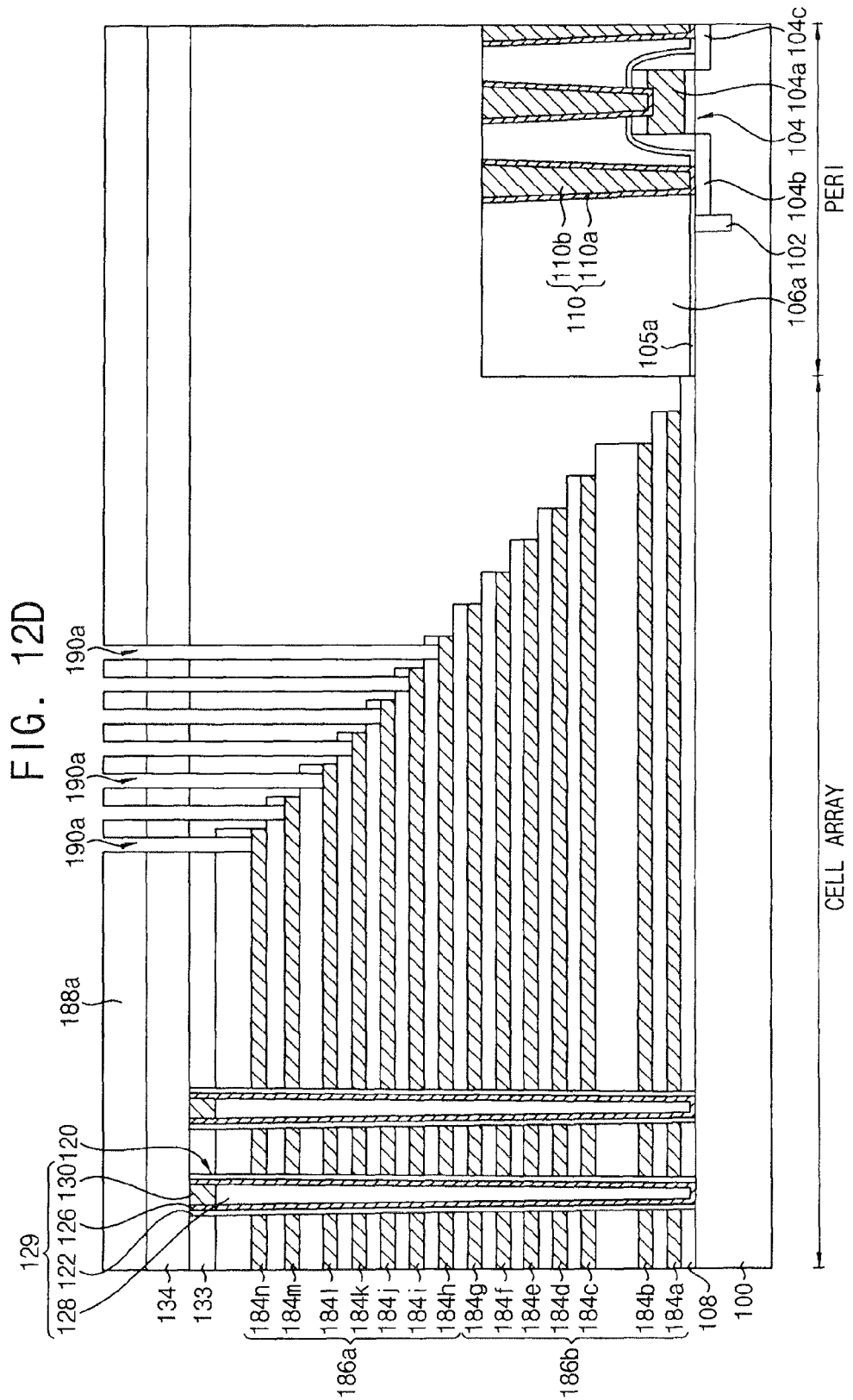

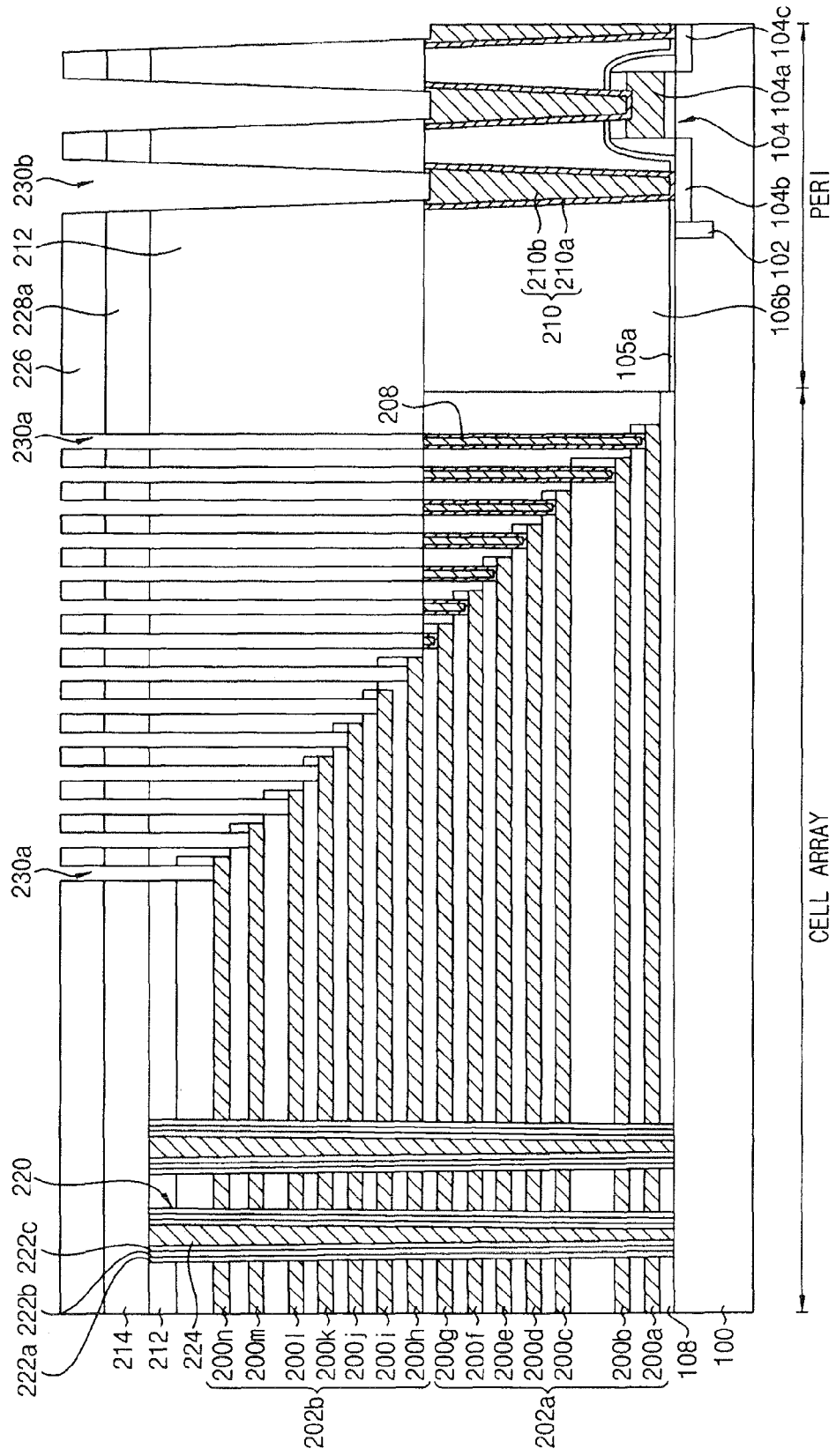

VERTICAL TYPE SEMICONDUCTOR DEVICE AND METHOD FOR MANUFACTURING THE SAME

CROSS-REFERENCE TO RELATED APPLICATION

This U.S. non-provisional application claims priority under 35 U.S.C. §119 to Korean Patent Application No. 10-2012-0077939 filed on Jul. 17, 2012 in the Korean Intellectual Property Office (KIPO), the disclosure of which is incorporated by reference herein in its entirety.

TECHNICAL FIELD

Exemplary embodiments of the inventive concept relate to a semiconductor device, and more particularly, to a vertical type semiconductor device and a method for manufacturing the same.

DISCUSSION OF THE RELATED ART

Semiconductor devices may be highly integrated by stacking cells on a substrate. The stacked cells are respectively provided with connection wires for applying electric signals thereto. The connection wires may be formed by performing a photolithography process several times, and during the process, failures may occur.

SUMMARY

According to an exemplary embodiment of the inventive concept, there is provided a vertical type semiconductor device. The vertical type semiconductor device includes a pillar structure protruding in a vertical direction from a surface of a substrate in a cell array region and including a channel pattern. Word lines surround the pillar structure. The word lines are stacked and are spaced apart from each other in the vertical direction. Word line contacts have first top surfaces higher than an uppermost word line. The word line contacts contact edges of the word lines. The edges of the word lines may function as pad portions, respectively. An insulating interlayer pattern is provided on the substrate in a peripheral circuit region disposed at a peripheral portion of the cell array region. The insulating interlayer pattern has a second top surface lower than a top surface of the pillar structure. A first contact plug passes through the insulating interlayer pattern and contacts the surface of the substrate in the peripheral circuit region. A second contact plug contacts a top surface of the first contact plug and has a third top surface aligned with the first top surfaces of the word line contacts.

In an exemplary embodiment of the inventive concept, the insulating interlayer pattern may have a height of about 35% to about 65% of a height of the pillar structure.

In an exemplary embodiment of the inventive concept, the word line contacts and the second contact plug may include substantially the same metal.

In an exemplary embodiment of the inventive concept, the first and second contact plugs each may include a barrier metal layer and a metal layer. The barrier metal layer of the second contact plug may directly contact the metal layer of the first contact plug.

In an exemplary embodiment of the inventive concept, the word lines may include a metal or polysilicon.

In an exemplary embodiment of the inventive concept, the word lines may be include upper word lines and lower word lines, and the lower word lines are extend over an upper portion of the insulating interlayer pattern such that the edges of the lower word lines may be disposed higher than the second top surface of the insulating interlayer pattern.

In an exemplary embodiment of the inventive concept, an uppermost pad portion of the lower word lines and an uppermost pad portion of the upper word lines may have substantially the same height and may be aligned in parallel to each other.

In an exemplary embodiment of the inventive concept, a first word line of the word lines located at a lower position may be longer in a horizontal direction than a second word line of the word lines located at an upper position.

According to an exemplary embodiment of the inventive concept, there is provided a vertical type semiconductor device. The vertical type semiconductor device includes a pillar structure protruding in a vertical direction from a surface of a substrate in a cell array region and including a channel pattern. Lower word lines surround the pillar structure. The lower word lines are stacked and are spaced apart from each other in the vertical direction. Upper word lines surround the pillar structure. The upper word lines are disposed on the lower word lines. An insulating interlayer pattern is provided on the substrate in a peripheral circuit region disposed at a peripheral portion of the cell array region. The insulating interlayer pattern has a first top surface positioned between the upper and lower word lines. Lower contacts may contact edges of the lower word lines. The edges of the lower word lines may function as pad portions, respectively. The lower contacts have second top surfaces aligned with the first top surface of the insulating interlayer pattern. First upper contacts may contact edges of the upper word lines. The edges of the upper word lines may function as pad portions, respectively. The first upper contacts have third top surfaces higher than an uppermost word line of the upper word lines. Second upper contacts have fourth top surfaces aligned with the third top surfaces of the first upper contacts. The second upper contacts may contact the lower contacts, respectively. A first contact plug passes through the insulating interlayer pattern and contacts the surface of the substrate in the peripheral circuit region. A second contact plug may contact a top surface of the first contact plug. The second contact plug has a fifth top surface aligned with the third and fourth top surfaces of the first and second upper contacts.

In an exemplary embodiment of the inventive concept, the lower contacts and the first contact plug may include the same metallic material In an exemplary embodiment of the inventive concept, the first and second upper contacts and the second contact plug may include the same metallic material In an exemplary embodiment of the inventive concept, the word lines may include polysilicon.

According to an exemplary embodiment of the inventive concept, there is provided a method of manufacturing a vertical type semiconductor device. In the method, an insulating interlayer pattern is formed on a substrate in a peripheral circuit region. A first contact plug passes through the insulating interlayer pattern and contacts the surface of the substrate. A pillar structure protrudes from a surface of the substrate in a cell array region in a vertical direction. The pillar structure has a first top surface positioned higher than a second top surface of the insulating interlayer pattern. The pillar structure includes a channel pattern. Word lines surround the pillar structure. The word lines are stacked and are spaced apart from each other in the vertical direction. An insulating interlayer covers the pillar structure, the word lines and the insulating interlayer pattern. Contact holes partially etch the insulating interlayer. The contact holes expose top surfaces of edges of the word lines. The contact holes expose a top surface of the first contact plug. The contact holes are filled with a conductive material to form word line contacts and a second contact plug. The word line contacts contact the word lines, respectively, and the second contact plug contacts the top surface of the first contact plug.

In an exemplary embodiment of the inventive concept, the insulating interlayer pattern may have a height of about 35% to about 65% of a height of the pillar structure.

In an exemplary embodiment of the inventive concept, the contact holes may be substantially simultaneously formed by the same photolithography process.

A semiconductor device is provided. The semiconductor device includes a substrate. The substrate includes a cell array area and a peripheral circuit area adjacent to the cell array area. An insulation interlayer pattern is disposed on the peripheral circuit area. A first word line is disposed on a top surface of the substrate. The first word line has a step-shaped edge. A second word line is disposed on the first word line. The second word line has a step-shaped edge. A pillar structure passes through the first and second word lines and contacts the top surface of the substrate. A first word line contact contacts the step-shaped edge of the first word line. A second word line contact contacts the step-shaped edge of the second word line. A first contact plug passes through the insulating interlayer pattern and contacts the top surface of the substrate. A second contact plug is disposed on the first contact plug. Top surfaces of the first and second word line contacts are aligned with a top surface of the second contact plug.

The first word line includes a first portion extending substantially parallel with the top surface of the substrate. A second portion extends substantially perpendicular to the first portion. A third portion extends substantially parallel with the top surface of the substrate. The second portion is positioned between the first and third portions.

A bottom surface of the second contact plug is smaller in width than a top surface of the first contact plug.

Part of the first word line is disposed on the peripheral circuit area.

The pillar structure includes a buried insulating layer pattern and a channel pattern on the buried insulating layer. The channel pattern contacts the top surface of the substrate.

BRIEF DESCRIPTION OF THE DRAWINGS

The above and other features of the inventive concept will become more apparent by describing in detail exemplar embodiments thereof with reference to the accompanying drawings in which:

FIGS. 4A to 4J are sectional views illustrating a method of manufacturing a vertical type semiconductor device shown in FIG. 2 according to an exemplary embodiment of the present inventive concept;

FIGS. 12A to 12E are sectional views illustrating a method of manufacturing a vertical type semiconductor device shown in FIG. 11 according to an exemplary embodiment of the present inventive concept;

FIGS. 17A to 17G are sectional views illustrating a method of manufacturing a vertical type semiconductor device shown in FIG. 15 according to an exemplary embodiment of the present inventive concept.

DETAILED DESCRIPTION OF THE EXEMPLARY EMBODIMENTS

Figure 1:
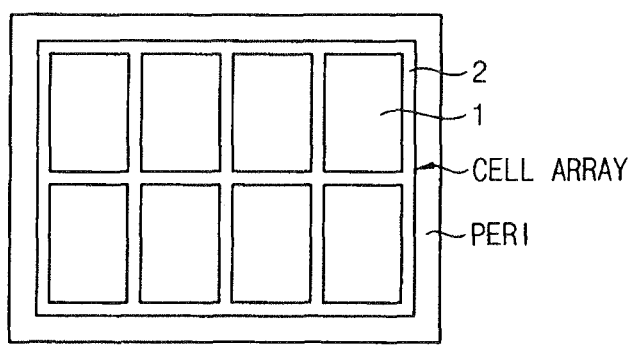
FIG. 1 is a plan view illustrating a cell arrangement in a memory device in accordance with an exemplary embodiment of the inventive concept.

Various exemplary embodiments of the present inventive concept will be hereinafter described in more detail with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like or similar elements throughout the specification and the drawings.

As used herein, the singular forms "a," "an" and "the" are intended to include the plural forms as well, unless the context clearly indicates otherwise.

FIG. 1 is a plan view illustrating a cell arrangement in a memory device in accordance with an exemplary embodiment of the inventive concept.

Referring to FIG. 1, the memory device is formed on a substrate. The substrate includes a cell array region CELL ARRAY on which memory cells are disposed and a peripheral circuit region PERI on which circuits are disposed to drive the memory cells. Cell blocks 1, on which the cells are formed, and a connection area 2 for electrically connecting the cell blocks 1 with each other are provided in the cell array region CELL ARRAY. The connection area 2 is disposed outside an outer peripheral portion of each cell block 1. For instance, the connection area 2 may surround all sidewalls of the cell blocks 1. The connection area 2 may be disposed corresponding to two sidewalls of the cell blocks, which face each other.

The cells formed in the cell block 1 may be stacked in a vertical direction. Electrical signals may be independently applied to conductive patterns included in each of the cells. A stack structure may be provided in the connection area 2 to independently apply electric signals to the conductive patterns.

Figure 2:
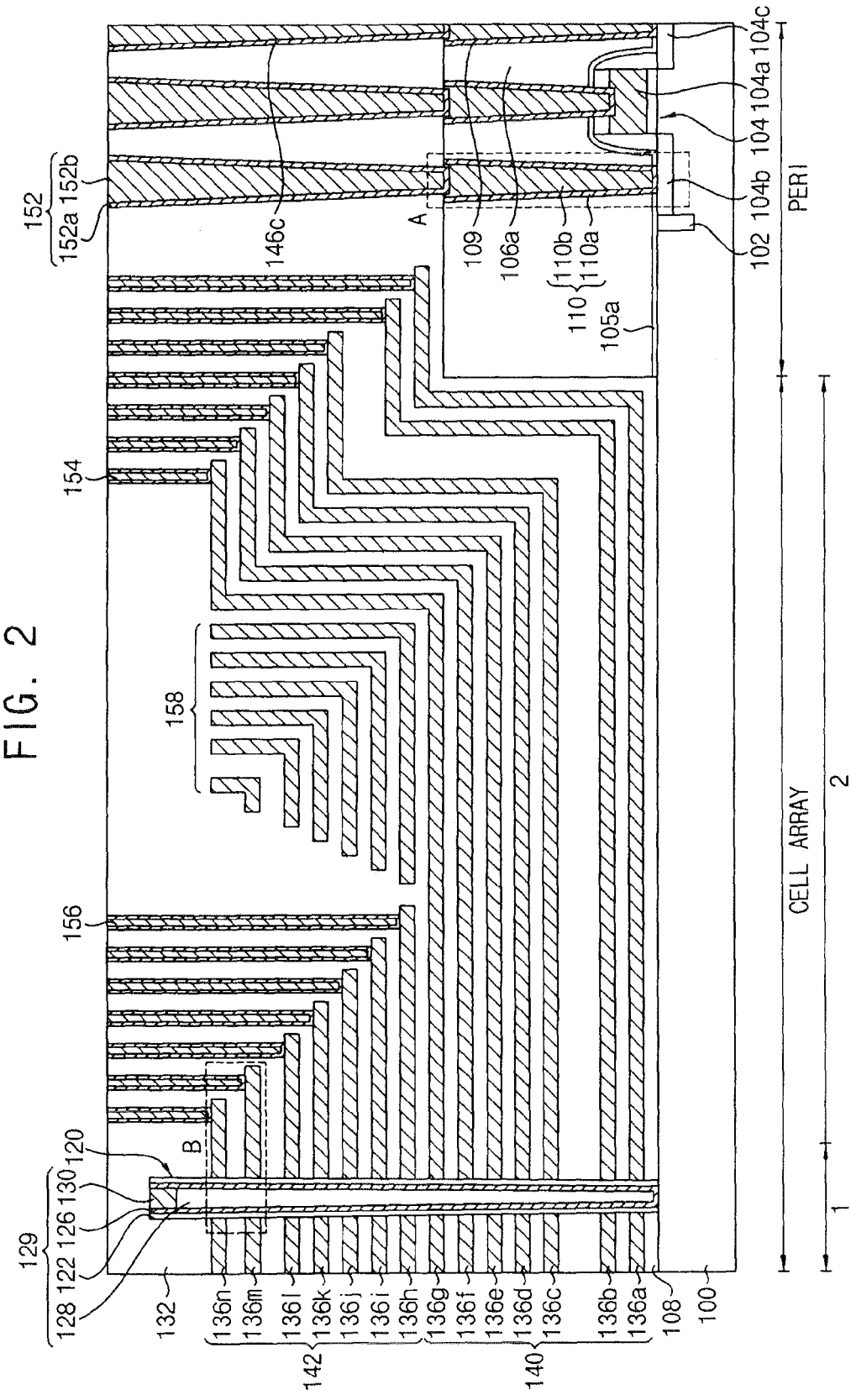
FIG. 2 is a sectional view illustrating a vertical type semiconductor device in accordance with an exemplary embodiment of the inventive concept.
Figure 3A:
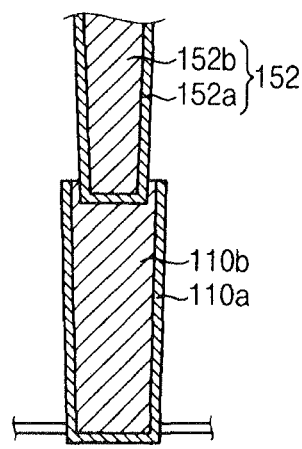
FIG. 3A is an enlarged view of portion 'A' shown in FIG. 2.
Figure 3B:
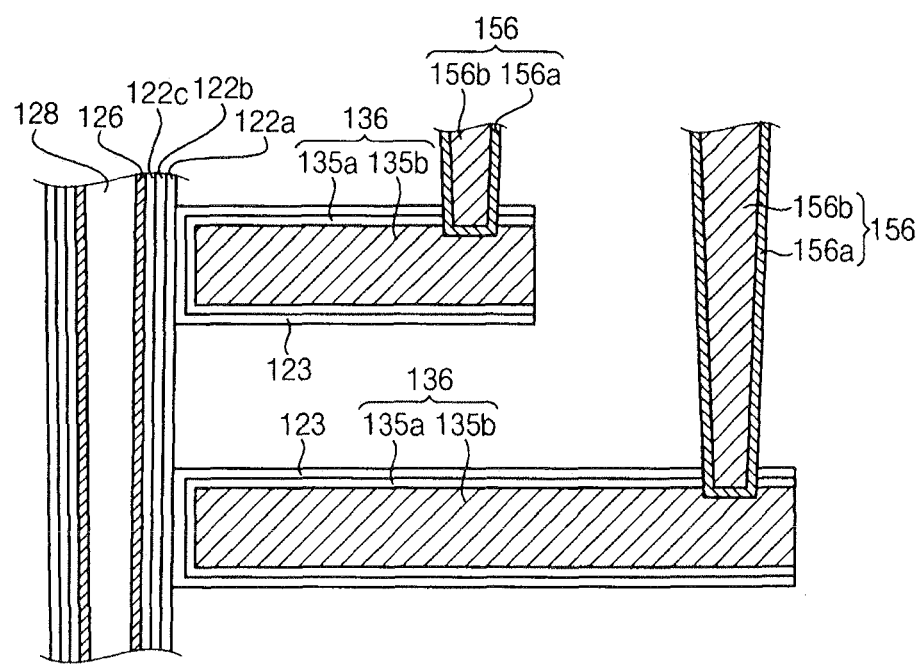
FIG. 3B is an enlarged view of portion 'B' shown in FIG. 2.

FIG. 2 is a sectional view illustrating a vertical type semiconductor device in accordance with an exemplary embodiment of the inventive concept. FIG. 3A is an enlarged view of portion 'A' shown in FIG. 2. FIG. 3B is an enlarged view of portion 'B' shown in FIG. 2.

Referring to FIG. 2, the vertical type semiconductor device is formed on a semiconductor substrate 100 including a cell array region CELL ARRAY and a peripheral circuit region PERI. The cell array region includes a cell block area 1 and a connection area 2.

The substrate 100 of the peripheral region is divided into an active region and a field region by an isolation layer pattern 102. MOS transistors 104 (only one MOS transistor is shown in FIG. 2) constituting the peripheral circuits are provided in the substrate 100 of the peripheral circuit region PERI. An etch stop layer pattern 105a may be provided on a surface of the substrate 100 of the peripheral circuit region PERI and surfaces of the MOS transistors 104.

A first insulating interlayer pattern 106a covers the MOS transistors 104. The first insulating interlayer pattern 106a may have a top surface lower than a pillar structure 120 formed in a cell array region. For instance, the first insulating interlayer pattern 106a may have a height between about 35% and about 65% of a height of the pillar structure 129.

First contact plugs 110 pass through the first insulating interlayer pattern 106a and are electrically connected to a gate 104a, a source 104b and a drain 104c of the MOS transistor 104. At least one of the first contacts plugs 110 contacts the surface of the substrate 100 in the peripheral circuit region PERI.

Since the first contact plugs 110 are provided in the first insulating interlayer pattern 106a, the first contact plugs 110 may have the height the same as the first insulating interlayer pattern 106a. The first contact plugs 110 each may have the top surface lower than a top surface of the pillar structure 129. For instance, the first contact plugs 110 each may have a height between about 35% and about 65% of the height of the pillar structure 129.

The first contact plugs 110 may have upper widths wider than lower widths. To increase the upper widths of the first contact plugs 110, sidewalls of the first contact plugs 110 may be inclined. The first contact plugs 110 are arranged such that neighbor first contact plugs 110 are not shorted.

Second contact plugs 152 are provided on the first contact plugs 110 while contacting the top surfaces of the first contact plugs 110. The second contact plugs 152 are formed through an upper insulating interlayer 132. The upper insulating interlayer 132 is an insulating layer to cover cells vertically stacked in the cell array region. The second contact plugs 152 may have top surfaces higher than the top surface of the pillar structure 129.

Since the widths of upper portions of the first contact plugs 110 are increased, a misalignment margin between the first and second contact plugs 110 and 152 may be sufficiently ensured. Thus, the contact failure between the first and second contact plugs 110 and 152 caused by the misalignment can be reduced.

The first and second contact plugs 110 and 152, which are stacked in the vertical direction, may function as a single contact. Thus, each of the first and second contact plugs 110 and 152 may have a height lower than a height of the pillar structure 129.

Referring to FIG. 3A, which is an enlarged view illustrating portion A shown in FIG. 2, the first and second contact plugs 110 and 152 include metals. The first and second contact plugs 110 and 152 may have a stacked structure of barrier metal layers 110a and 152a and metal layers 110b and 152b.

As shown in FIGS. 3A and 3B, the first contact plug 110 has a stacked structure of a first barrier metal layer 110a, which is provided along a sidewall and a bottom surface of a first contact hole 109, and a first metal layer 110b formed on the first barrier metal layer 110a to fill the first contact hole 109. The second contact plug 152 has a stacked structure of the second barrier metal layer 152a, which is provided along a sidewall and a bottom surface of a fourth contact hole 146c, and a second metal layer 152b formed on the second barrier metal layer 152a to fill the fourth contact hole 146c. Since the top surface of the first contact plug 110 is exposed to the bottom surface of the fourth contact hole 146c, the second barrier metal layer 152a of the second contact plug 152 directly contacts the top surface of the first metal layer 110b of the first contact plug 110.

Examples of materials used for the first and second barrier metal layers 110a and 152 may include titanium, titanium nitride, tantalum, and/or tantalum nitride. These materials may be used alone or in a combination thereof. Examples of materials used for the first and second metal layers 110b and 152b may include tungsten, tungsten nitride, copper, and/or aluminum. These materials may be used alone or in a combination thereof. Tungsten may be used for the first and second metal layers 110b and 152b.

Since the first and second contact plugs 110 and 152 are vertically stacked and are provided as a contact structure, the contact structure may have a bent sidewall between the first and second contact plugs 110 and 152.

Flash memory cells, which are stacked in the vertical direction, may be provided in the cell block area 1 of the cell array region. A flash memory cell according to an exemplary embodiment of the inventive concept has the following structure.

Pillar structures including a pillar structure 129 substantially vertically protrude from the substrate 100 of the cell block region.

Referring to FIG. 3B, which is an enlarged view of portion 'B' shown in FIG. 2, the pillar structure 129 may have a stack structure, in which a channel pattern 126, a tunnel insulating layer pattern 122c, a charge trap layer pattern 122b and a first dielectric layer pattern 122a are sequentially stacked in the lateral direction of a buried insulating layer pattern 128 having a cylindrical shape. In FIG. 2, the tunnel insulating layer pattern 122c, the charge trap layer pattern 122b and the first dielectric layer pattern 122a are illustrated as a single layer 122.

The buried insulating layer pattern 128 may include silicon oxide. The channel pattern 126 may include silicon. The tunnel insulating layer pattern 122c may include silicon oxide. The charge trap layer pattern 122b may include silicon nitride. The first dielectric layer pattern 122a may include silicon oxide.

Gate structures including word lines 140 and 142 are stacked at a sidewall of the pillar structure 129 while being spaced apart from each other by a predetermined interval. Insulating layer patterns 108 are provided between the gate structures and insulate the gate structures from each other. The gate structures may have a line shape extending in one direction while surrounding the pillar structures.

In FIG. 2, only the word lines 140 and 142 included in the gate structures are illustrated, for example. However, a gate structure may have a sectional shape as shown in FIG. 3B.

Referring to FIG. 3B, a gate structure has a stack structure of a second dielectric layer pattern 123 and a word line 136. The word line 136 functions as a control gate electrode in a cell corresponding to the word line 136.

The second dielectric layer pattern 123 is provided along the bottom surface of an upper insulating layer pattern 108, the surface of the first dielectric layer pattern 122a and the top surface of a lower insulating layer pattern 108. The second dielectric layer pattern 123 may have a dielectric constant higher than a dielectric constant of the first dielectric layer pattern 122a. The second dielectric layer pattern 123 may include metal oxide. The second dielectric layer pattern 123 may include metal oxide. Examples of materials used for the second dielectric layer pattern 123 may include aluminum oxide, hafnium oxide, lanthanum oxide, lanthanum aluminum oxide, lanthanum hafnium oxide, hafnium aluminum oxide, titanium oxide, tantalum oxide, and/or zirconium oxide. These materials may be used alone or in a combination thereof.

The word lines 140 and 142 include a third barrier metal layer 135a and a third metal layer 135b. The third barrier metal layer 135a directly contacts the second dielectric layer pattern 123 and is provided along the top surface of the second dielectric layer pattern 123. The third metal layer 135b is provided on the third barrier metal layer 135a and may completely fill an internal space defined by the upper and lower insulating layer patterns 108 and the first dielectric layer pattern 122a. The third barrier metal layer 135a may include titanium, titanium nitride, tantalum and/or tantalum nitride. The third barrier metal layer 135a may include tungsten, tungsten nitride, copper and/or aluminum.

Each of the memory cells in the cell block area 1 may include the tunnel insulating layer pattern 122c, the charge trap layer pattern 122b, first and second dielectric layer patterns 122a and 123, and word lines that are stacked in a lateral direction of the channel pattern 126. Among the memory cells prepared in the layered structure, one or two uppermost or lowermost cells may be used as select gate transistors.

The memory cells, which are vertically stacked, are divided into upper and lower memory cells according to the positions thereof. Word lines formed in the lower position are referred to as first group word lines 140, and word lines formed in the upper position are referred to as second group word lines 142.

The word lines horizontally provided in the cell block area 1 may extend beyond the connection area 2.

The first group word lines 140 may extend beyond the connection area up to an outer peripheral portion of the peripheral circuit region PERI. The first group word lines 140 may extend longer than the second group word lines 142.

The first group word lines 140 each may include a first section extending in a direction substantially parallel with the top surface of the substrate 100, a second section vertically bent at a sidewall of the first insulating interlayer pattern 106a and extending upward, and a third section extending in the direction substantially parallel with the top surface of the first insulating interlayer pattern 106a. The second and third sections of the first group word line 140 are formed due to the step difference between the surface of the substrate 100 and the first insulating interlayer pattern 106a. Thus, the third section, which is an edge portion of the first group word line 140, is located higher than the top surface of the first insulating interlayer pattern 106a.

The first to third sections of the first group word line 140 are continuously formed without disconnection. In the third section, a lower word line is longer than an upper word line. Thus, an edge portion of the first group word line 140 has a stepped shape. In the third section, an upper portion of an edge of each word line may function as a pad portion which a corresponding word line may contact.

The second group word lines 142 may extend only in the horizontal direction, for example. In this case, the second group word lines 142 have no sections vertically that are bent and extended upward.

In the second group word lines 142, the length of a word line located in a lower position is longer than the length of a word line located in an upper position. Thus, the edge portion of the second group word line 142 has a stepped shape. An edge portion of the top surface of the second group word line 142 may function as a pad portion to thus form a word line contact.

As shown in FIG. 2, the uppermost pad portions of the first group word lines 140 have substantially the same height as the uppermost pad portions of the second group word lines 142 and are aligned substantially in parallel to the uppermost pad portions of the second group word lines 142. The pad portions of the first and second group word lines 140 and 142 in each layer may be aligned substantially in parallel to each other and may have substantially the same height as each other.

Dummy patterns 158, which may remain after an etching process for forming the pad portions, may be provided in the lateral direction of the second group word line 142.

The upper insulating interlayer 132 covers the first and second group word lines 140 and 142.

First word line contacts 154 pass through the upper insulating interlayer 132 and contact the pad portions formed in the third sections of the first group word lines 140, respectively. Second word line contacts 156 pass through the upper insulating layer 132 and contact the pad portions of the second group word lines 142, respectively.

As shown in FIG. 3B, the second word line contacts 156 directly contact the third metal layers 135b included in their respective corresponding word lines 142. The first word line contacts 154 may also directly contact the third metal layers 135b included in their respective corresponding word lines 140.

The first and second word line contacts 154 and 156 each include a fourth barrier metal layer 156a and a fourth metal layer 156b. The fourth barrier metal layer 156a is provided along the sidewall and bottom surface of the contact hole. The fourth metal layer 156b is formed on the fourth barrier metal layer 156a and fills the contact hole.

The fourth barrier metal layer 156a may include substantially the same material as the second barrier metal layer 152a. The fourth metal layer 155b may include substantially the same material as the second metal layer 152b. The first and second word line contacts 154 and 156 may be formed substantially simultaneously with the second contact plug 152.

According to an exemplary embodiment of the inventive concept, the first word line contacts 154 do not extend to the surface of the substrate 100 and may be disposed over the first insulating interlayer pattern 106a. Thus, the depth of the first and second word line contacts 154 and 156 may be reduced.

The contact structures connected to the peripheral circuits each have a stack structure in which the first and second contact plugs 110 and 152 are stacked in a vertical direction. Therefore, each of the first and second contact plugs 110 and 152 has a height lower than a height of the pillar structure 129. Since the height of the first and second contact plugs 110 and 152 is smaller compared with the pillar structure 129, when contacts are formed in the peripheral circuits, the substrate 100 may be prevented from being accidentally etched, insufficiently exposed, or shorted.

FIGS. 4A to 4J are sectional views illustrating a method of manufacturing the vertical type semiconductor device shown in FIG. 2 according to an exemplary embodiment of the present inventive concept.

Figure 4A:
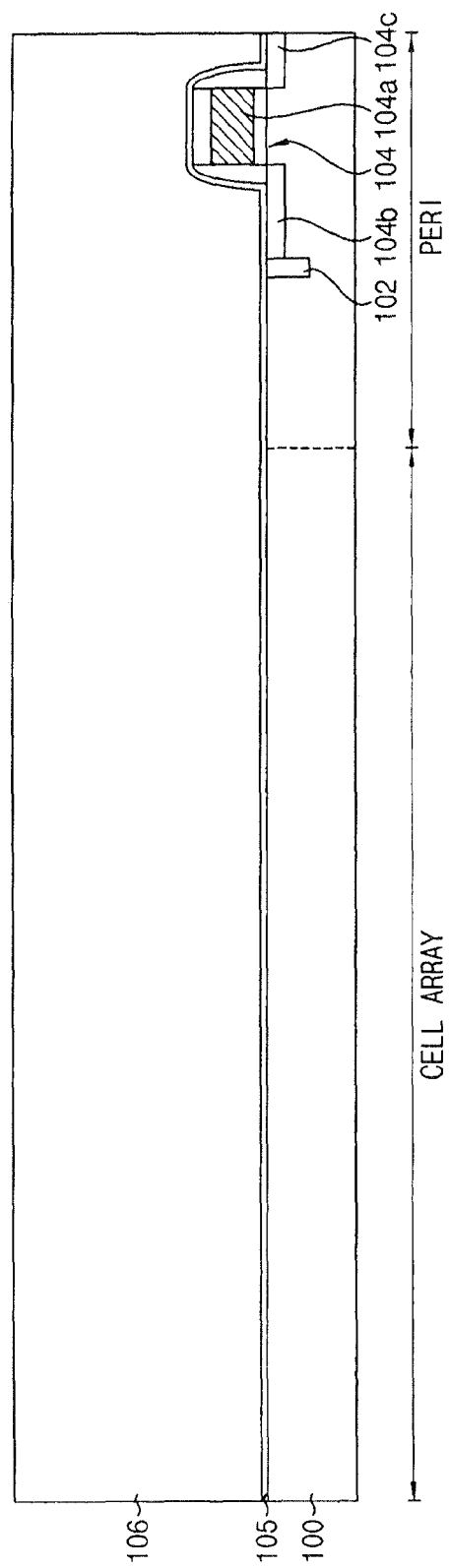

Referring to FIG. 4A, a semiconductor substrate 100 including a cell array region CELL ARRAY and a peripheral circuit region PERI is prepared. The cell array region of the substrate 100 may include a cell block area where cells are formed and a connection area where connection circuits are formed.

An isolation layer pattern 102 is formed on the peripheral circuit region PERI of the substrate 100 and the isolation layer pattern 102 defines an active region and a field region. MOS transistors 104 constituting peripheral circuits are formed on the active region of the substrate 100. Thereafter, an etch stop layer 105 may cover the substrate 100 and the MOS transistors 104. The etch stop layer 105 may include silicon nitride.

Then, a first insulating interlayer 106 is formed on the substrate 100 and covers the MOS transistors 104. Thereafter, the first insulating interlayer 106 is planarized.

The height of upper and lower word line groups may be determined depending on the thickness of the first insulating interlayer 106. For example, when the first insulating interlayer 106 has a relatively large thickness, the height of the first word line group located at a lower position may be increased. When the first insulating interlayer 106 has a relatively small thickness, the height of the first word line group may be decreased. For instance, the first insulating interlayer 106 may have a height between about 35% and about 60% of the height of a pillar structure formed in the cell block area.

Figure 4B:
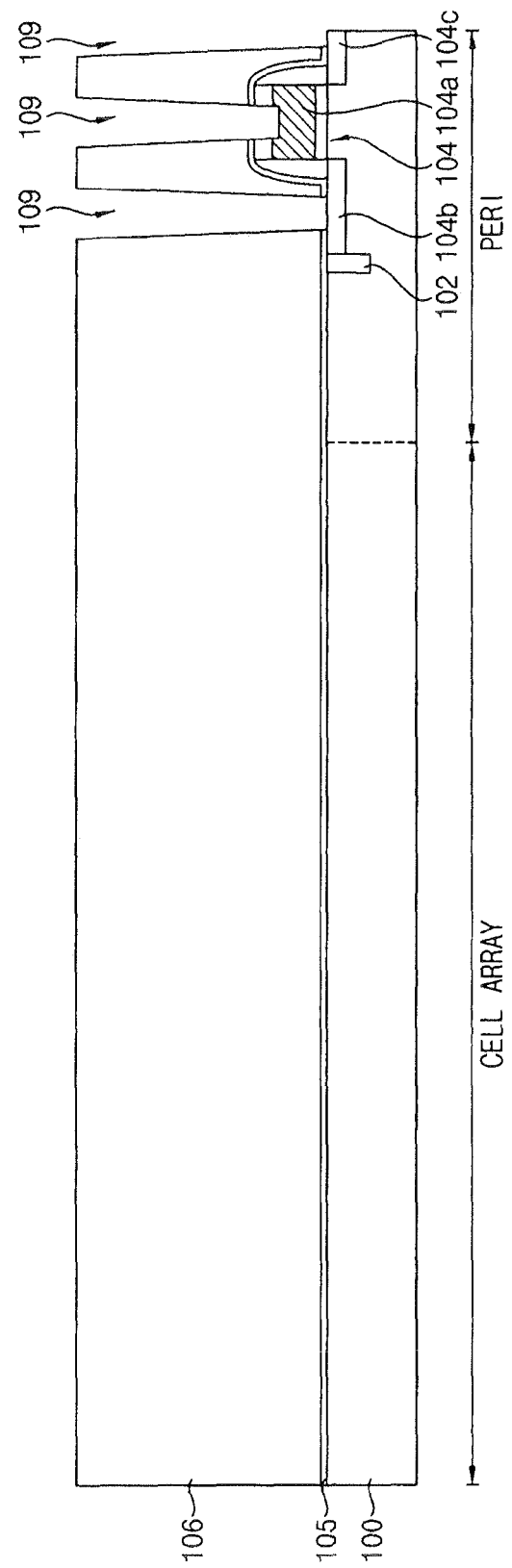

Referring to FIG. 4B, the first insulating interlayer 106 and the etch stop layer 105 are partially etched through a photolithography process to form first contact holes 109 that expose the gate 104a and source/drain regions 104b and 104c of the MOS transistor 104. The etching process may include an anisotropic etching process.

The first contact holes 109 expose the substrate surface or the top surface of the gate corresponding to the source/drain regions. However, controlling the etching process may not be easy when forming the first contact holes. When the substrate surface is over etched, an impurity region constituting the source/drain regions 104b and 104c may be consumed. In contrast, when the first insulating interlayer 106 and the etch stop layer 105 are not sufficiently etched when forming the first contact holes 109, the surface of the substrate 100 is not exposed, thereby causing the contact to fail to reach the substrate 100. When the layers to be etched have a relatively large thickness, the process may undergo an increased variation, and thus, the substrate 100 may be over-etched or is not fully exposed due to insufficient etching.

However, according to an exemplary embodiment of the inventive concept, the etching process is performed to the extent of the thickness of the first insulating interlayer 106 and the etch stop layer 105 when forming the first contact holes 109. Thus, the thickness of the etched layer is not large. For example, since the layer is etched to the extent of about 35% to about 60% of the height of the pillar structure, the etching process does not experience a large variation, and the thickness of the etched layer can be controlled. Thus, the substrate 100 may be prevented from being over-etched or insufficiently exposed.

Figure 4C:
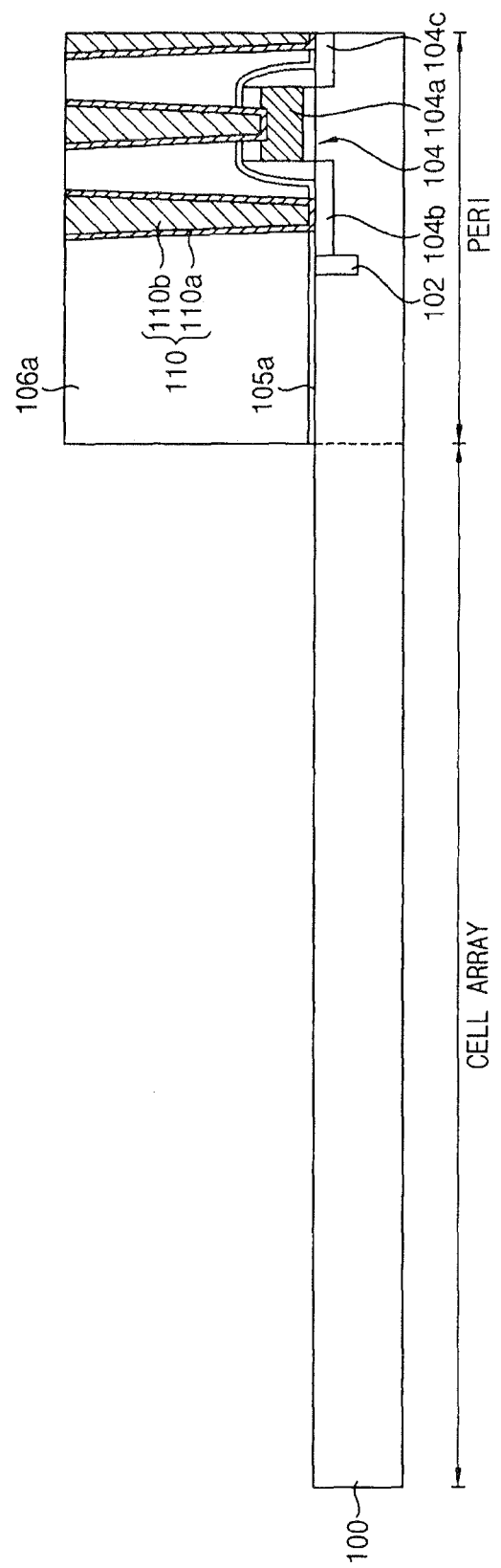

Referring to FIG. 4C, a metal fills the first contact holes 109 to form first contact plugs 110.

A first barrier metal layer 110a is formed along the sidewall and the bottom surface of the first contact hole 109 and the first insulating interlayer 106. Examples of materials used for the first barrier metal layer 110a may include titanium, titanium nitride, tantalum, and/or tantalum nitride. These materials may be used alone or in a combination thereof. Then, a first metal layer 110b is formed on the first barrier metal layer 110a completely filling the first contact hole 109. Examples of materials used for the first metal layer 110b may include tungsten, copper, and/or aluminum. The materials may be used alone or in a combination thereof. Thereafter, the first metal layer 110b and the first barrier metal layer 110a formed on the first insulating interlayer 106 are removed through a planarization process to form a first contact plug 110. The planarization process may include a chemical mechanical polishing process or an etch-back process.

Then, the first insulating interlayer 106 formed in the cell array region is etched to form the first insulating interlayer pattern 106a. Then, the etch stop layer 105 is removed and exposes the substrate 100 of the cell array region, thereby forming an etch stop layer pattern 105a. Thus, the first insulating interlayer pattern 106a and the etch stop layer pattern 105a are formed in the peripheral circuit region PERI.

Due to the first insulating interlayer pattern 106a, a step difference may be formed between the cell array region and the peripheral circuit region PERI.

Figure 4D:
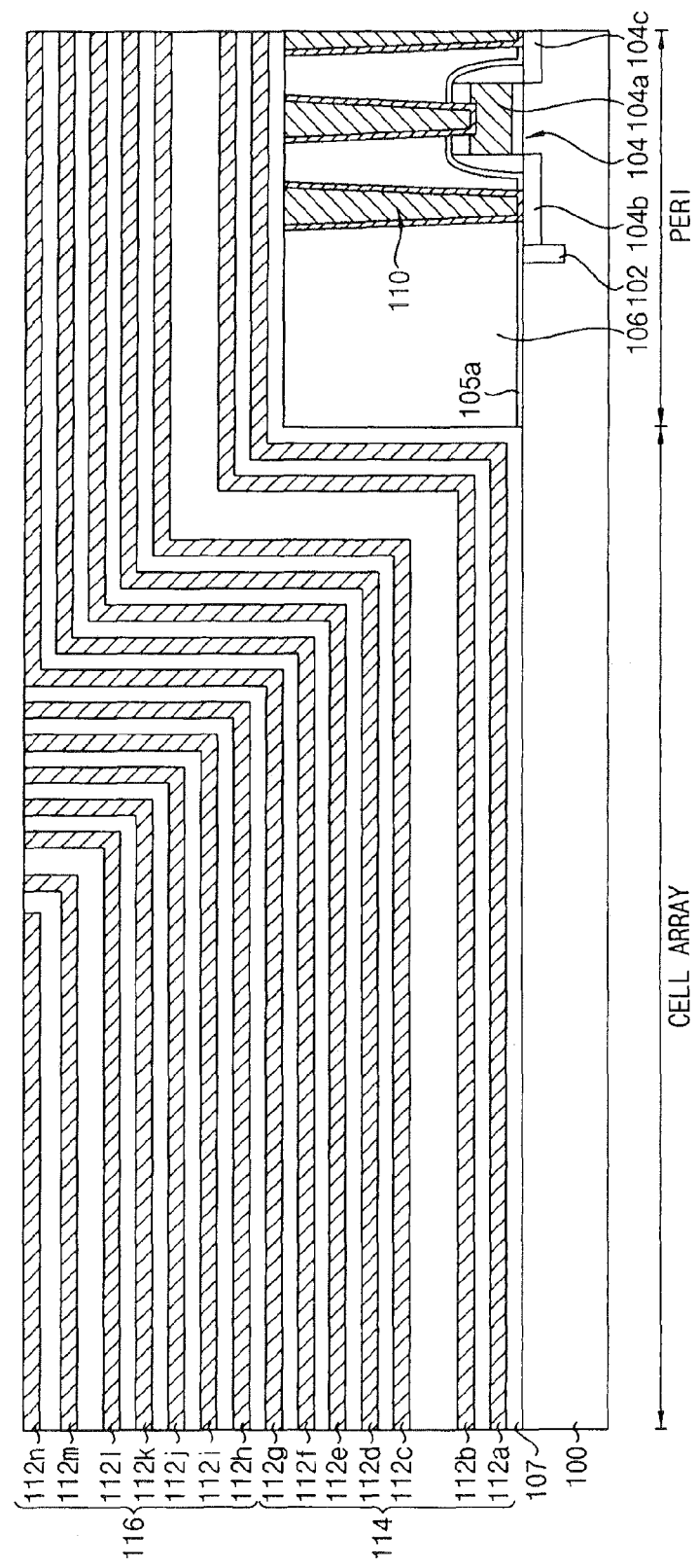

Referring to FIG. 4D, insulating layers 107 are formed along the surface of the substrate 100 of the cell array region and the surface of the first insulating interlayer pattern 106a. Sacrificial layers 114 and 116 including materials having etching selectivity with respect to the insulating layers 107 are formed on the insulating layers 107. For instance, the insulating layers 107 may include silicon oxide, and the sacrificial layers 114 and 116 may include silicon nitride.

The insulating layers 107 and the sacrificial layers 114 and 116 are alternately and repeatedly stacked. The region where the sacrificial layers 114 and 116 are formed may be the region where word lines are formed in a subsequent process. The number of the sacrificial layers 114 and 116 may correspond to the number of the memory cells which are vertically stacked.

Hereinafter, in each of the insulating layers 107 and the sacrificial layers 114 and 116, a section extending in a horizontal direction on the top surface of the substrate 100 is referred to as a first section, a section extending in a vertical direction at a sidewall of the first insulating interlayer pattern 106a is referred to as a second section, and a section extending in the horizontal direction on the top surface of the first insulating interlayer pattern 106a is referred to as a third section. The insulating layers and the sacrificial layers located at a lower position are referred to as first group insulating layers and first group sacrificial layers 114, and the insulating layers and the sacrificial layers located at an upper position are referred to as second group insulating layers and second group sacrificial layers 116.

Then, the upper portions of the insulating layers 107 and the sacrificial layers 114 and 116 are removed through a polishing process to form the insulating layers and the sacrificial layers having flat upper portions. The polishing process includes a chemical mechanical polishing process. The parts of the insulating layers and the sacrificial layers removed through the polishing process are adjusted such that the first group insulating layers 107 and the first group sacrificial layers 114 may include the first to third sections and the second group insulating layers 107 and the second group sacrificial layers 116 may include only the first and second sections.

As the polishing process is performed, the second group insulating layers 107 and the second group sacrificial layers 116 located at the upper position are primarily removed. In the second group insulating layers 107 and the second group sacrificial layers 116, parts protruding upward from the first insulating interlayer pattern 106a are primarily removed.

During the polishing process, the third sections of the second group insulating layers 107 and the second group sacrificial layers 116 are completely removed. Thus, the second group insulating layers 107 and the second group sacrificial layers 116 each may include only the first section extending in the horizontal direction on the top surface of the substrate 100 and the second section extending in the vertical direction at the sidewall of the first insulating interlayer pattern 106a.

The first group insulating layers 107 and the first group sacrificial layers 114 are not removed during the polishing process. Thus, the first group insulating layers 107 and the first group sacrificial layers 114 may include the first section extending in the horizontal direction on the top surface of the substrate 100, the second section extending in the vertical direction at the sidewall of the first insulating interlayer pattern 106a, and the third section extending in the horizontal direction on the top surface of the first insulating interlayer pattern 106a.

Figure 4E:
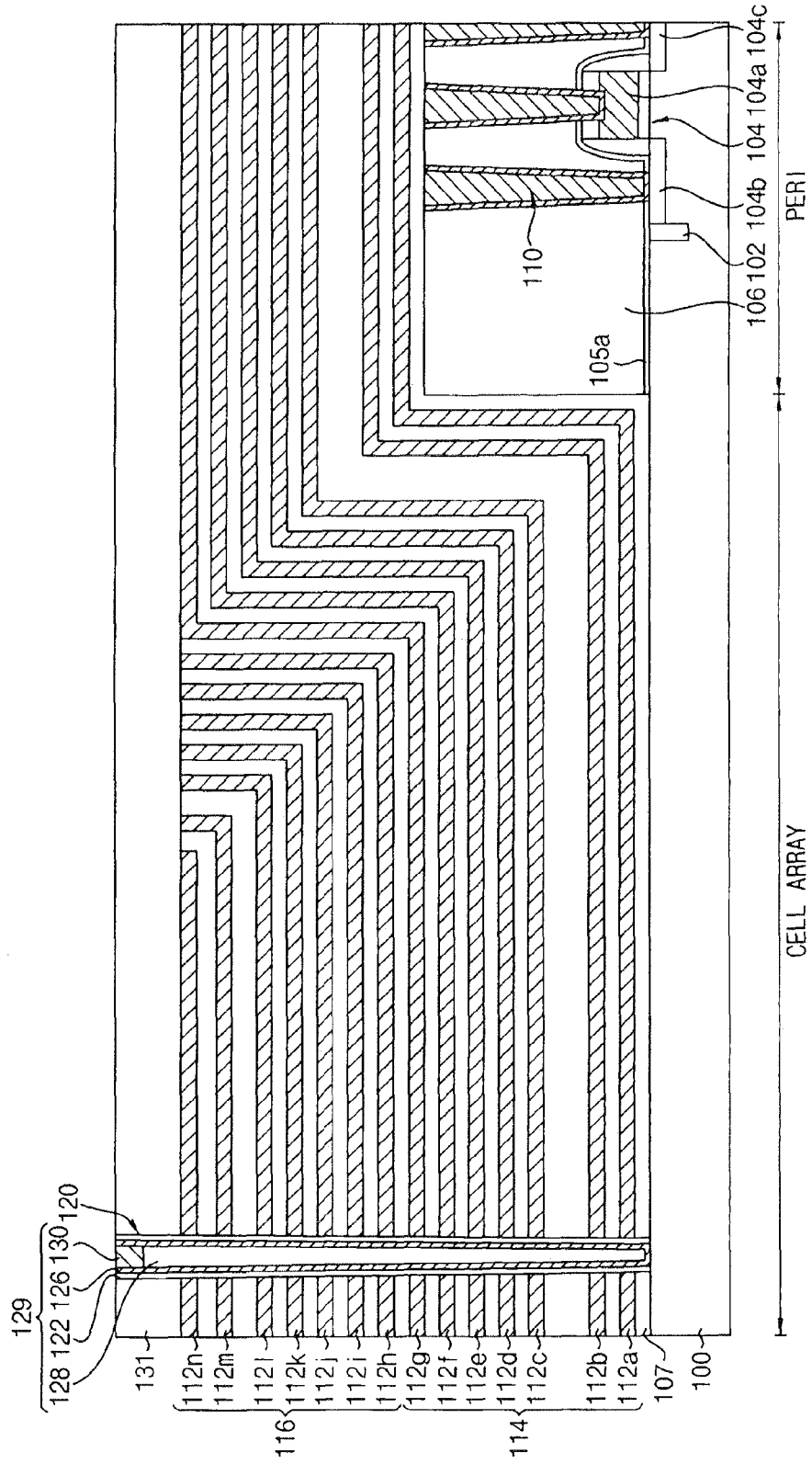

Referring to FIG. 4E, an insulating interlayer 131 covers the uppermost layer, e.g., the sacrificial layer 112n.

Then, channel holes 120 (only one channel hole is shown in FIG. 4E) for exposing the surface of the substrate 100 are formed in the cell block area by etching the insulating interlayer 131, the sacrificial layers 114 and 116 and the insulating layers 107. A selective epitaxial process may be further performed to form a semiconductor pattern that partially fills a lower portion of the channel hole 120.

Thereafter, as shown in FIG. 3B, the first dielectric layer, the charge trap layer and the tunnel insulating layer are formed along the sidewall of the channel hole 120 and along the surface of the substrate 100. Then, the first dielectric layer, the charge trap layer and the tunnel insulating layer, which are formed at the bottom surface of the channel hole 120, are removed through an anisotropic process. Thus, the first dielectric layer pattern 122a, the charge trap layer pattern 122b and the tunnel insulating layer pattern 122c having a spacer shape are formed at the sidewall of the channel hole 122. The charge trap layer may include silicon nitride. The tunnel insulating layer may include silicon oxide. The first dielectric layer may include silicon oxide. In FIGS. 4E to 4J, the first dielectric layer pattern 122a, the charge trap layer pattern 122b and the tunnel insulating layer pattern 122c are illustrated as a single layer 122.

Then, the channel pattern 126 is formed on the surfaces of the tunnel insulating layer pattern 122c and on the substrate 100 along the sidewall and the bottom surface of the channel holes 120. The channel pattern 126 may include a silicon layer.

The buried insulating layer pattern 128, which may completely fills the channel hole 120, is formed on the channel pattern 126. A conductive pattern 130 electrically connected to the channel pattern 126 is formed on the buried insulating layer pattern 128. The conductive pattern 130 is configured to block an inlet of the channel hole 120. Therefore, the pillar structures 129 are formed.

Figure 4F:
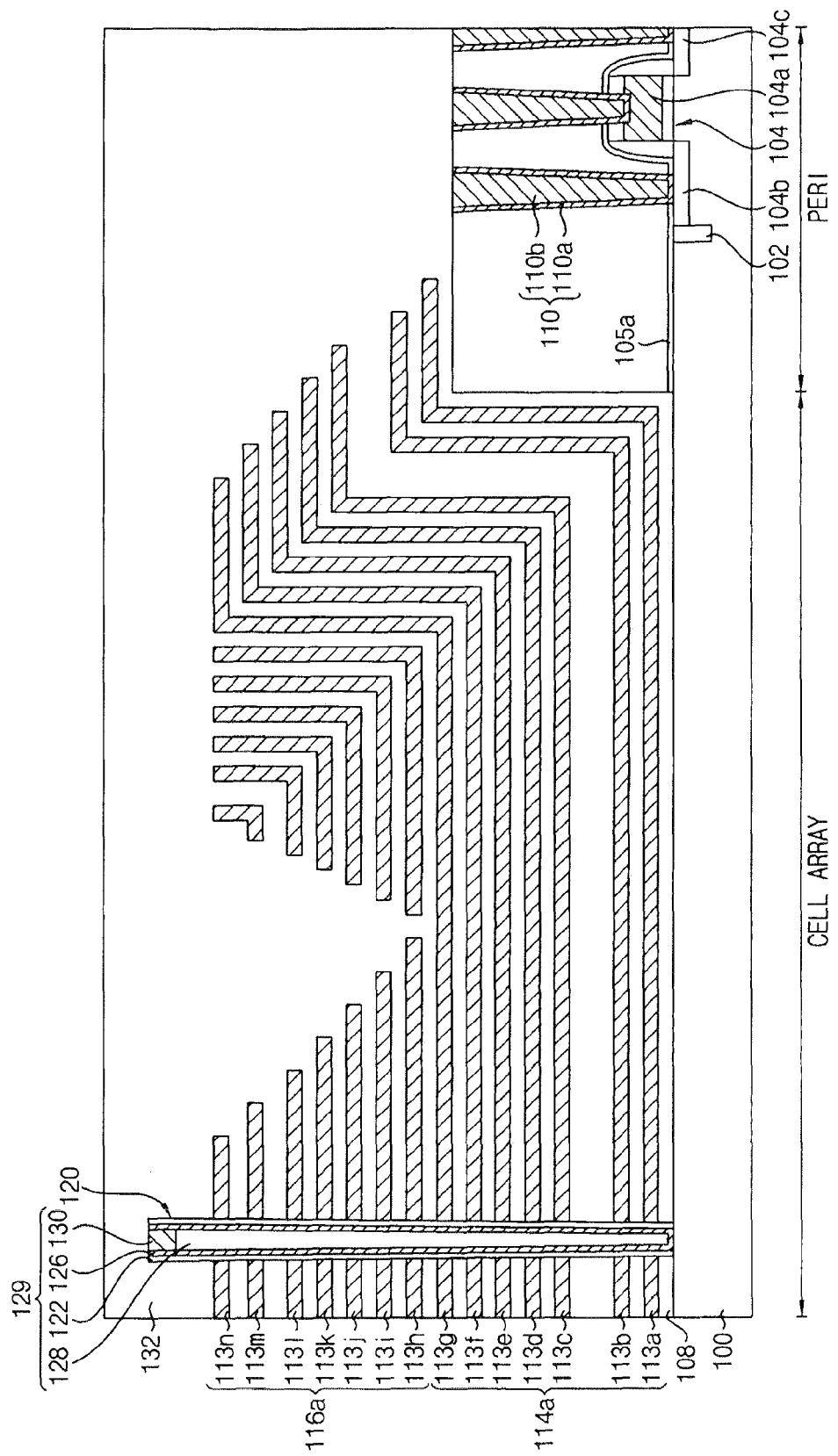

Referring to FIG. 4F, edge portions of the sacrificial layers and insulating layers 114, 116 and 107 are etched so that the sacrificial layer patterns 114a and 116a and the insulating layer pattern 107a having step-shaped edge portions are formed.

The etching process may be performed such that the edge portion of the first group sacrificial layer pattern 114a is located higher than the first insulating interlayer pattern 106a. The first group sacrificial layer pattern 114a may include all of the first to third sections. The second group sacrificial layer pattern 116a may include only the first section. The second group sacrificial layer pattern 116a may have a length smaller than a length of the first group sacrificial layer pattern 114a in the horizontal direction. The top surface of the third section of the first group sacrificial layer pattern 114a may have a height substantially the same as a height of the top surface of the second group sacrificial layer pattern 116a.

Then, the upper insulating interlayer 132 is formed covering the first group sacrificial layer pattern 114a, the second group sacrificial layer pattern 116a and the pillar structure 129.

Referring to FIG. 4G, parts of the insulating layer patterns 108 and the sacrificial layer patterns 114a and 116a are subjected to a dry etching process to form a second opening (not shown). The second opening may have a trench shape extending in an extension direction of the word line. Then, the sacrificial layer patterns 114a and 116a exposed to the sidewall of the second opening are removed forming recesses between the insulating layer patterns 108.

As shown in FIG. 3B, a second dielectric layer is formed on the surface of the recess. The second dielectric layer can be conformally formed along the surfaces of the insulating layer pattern and the first dielectric layer pattern 122a. The second dielectric layer can be formed by depositing a material having a dielectric constant higher than a dielectric constant of the first dielectric layer pattern 122a. The second dielectric layer may be formed by using metal oxide. Examples of the metal oxide may include aluminum oxide, hafnium oxide, lanthanum oxide, lanthanum aluminum oxide, lanthanum hafnium oxide, hafnium aluminum oxide, titanium oxide, tantalum oxide, and/or zirconium oxide. These materials may be used alone or in a combination thereof.

A word line layer is formed on the second dielectric layer to thus fill the recess. The word line layer has a stack structure of the third barrier metal layer 135a and the third metal layer 135b. The third barrier metal layer 135a is conformally formed along the surface of the second dielectric layer. The third metal layer 135b is formed on the third barrier metal layer 135a to fill the recess. Examples of materials used for the third barrier metal layer 135a may include titanium, titanium nitride, tantalum, and/or tantalum nitride. These materials may be used alone or in a combination thereof. Examples of materials used for the third metal layer 135b may include tungsten, copper, and/or aluminum. These materials may be used alone or in a combination thereof.

Then, the word line layer is etched and is separated for each layer, thereby forming the word lines 140 and 142. The word lines 140 and 142 may include the third barrier metal layers 135a and the third metal layers 135b.

Thus, the first group word lines 140 and the second group word lines 142 are formed.

Figure 4H:
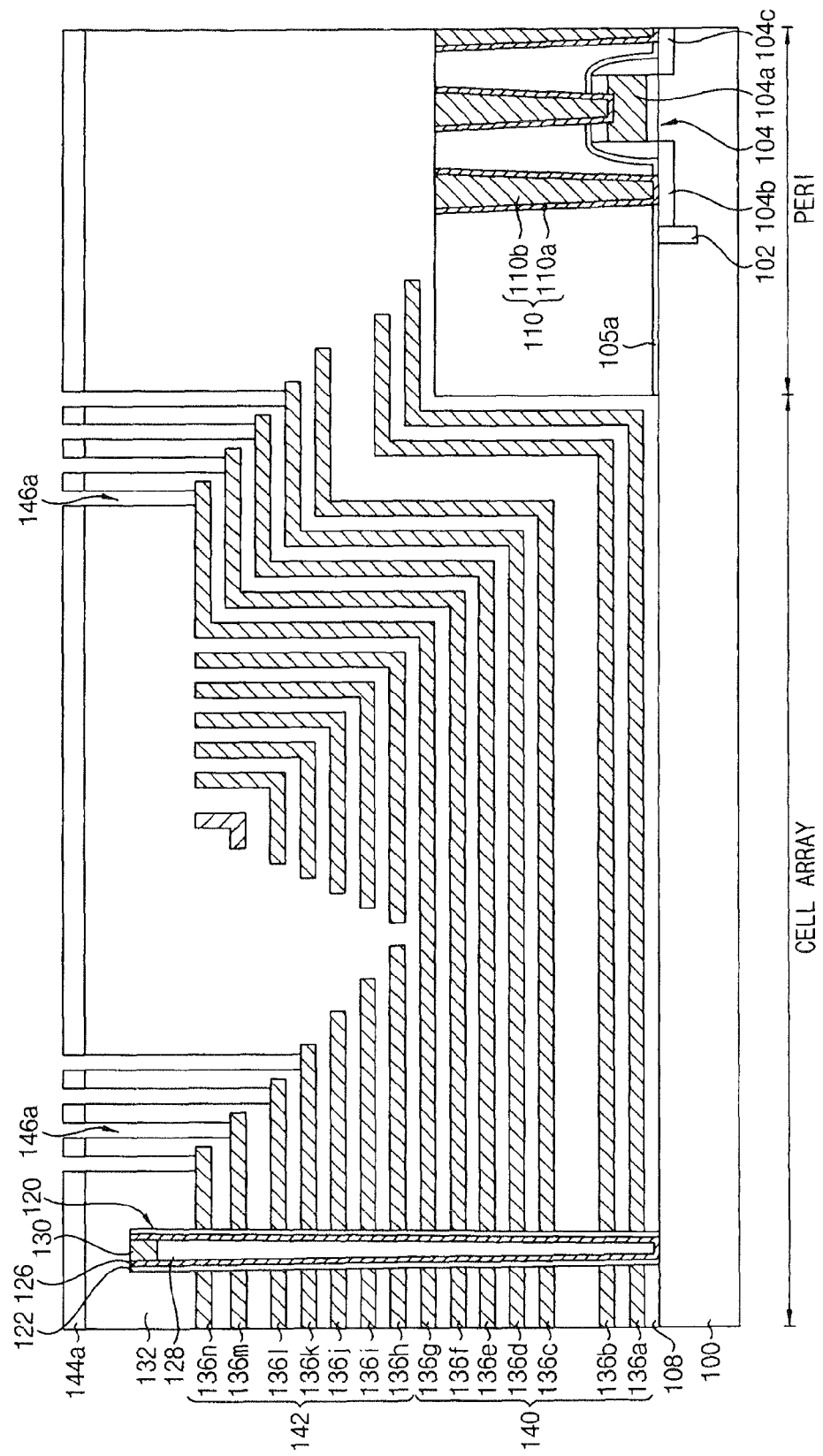
Figure 41:
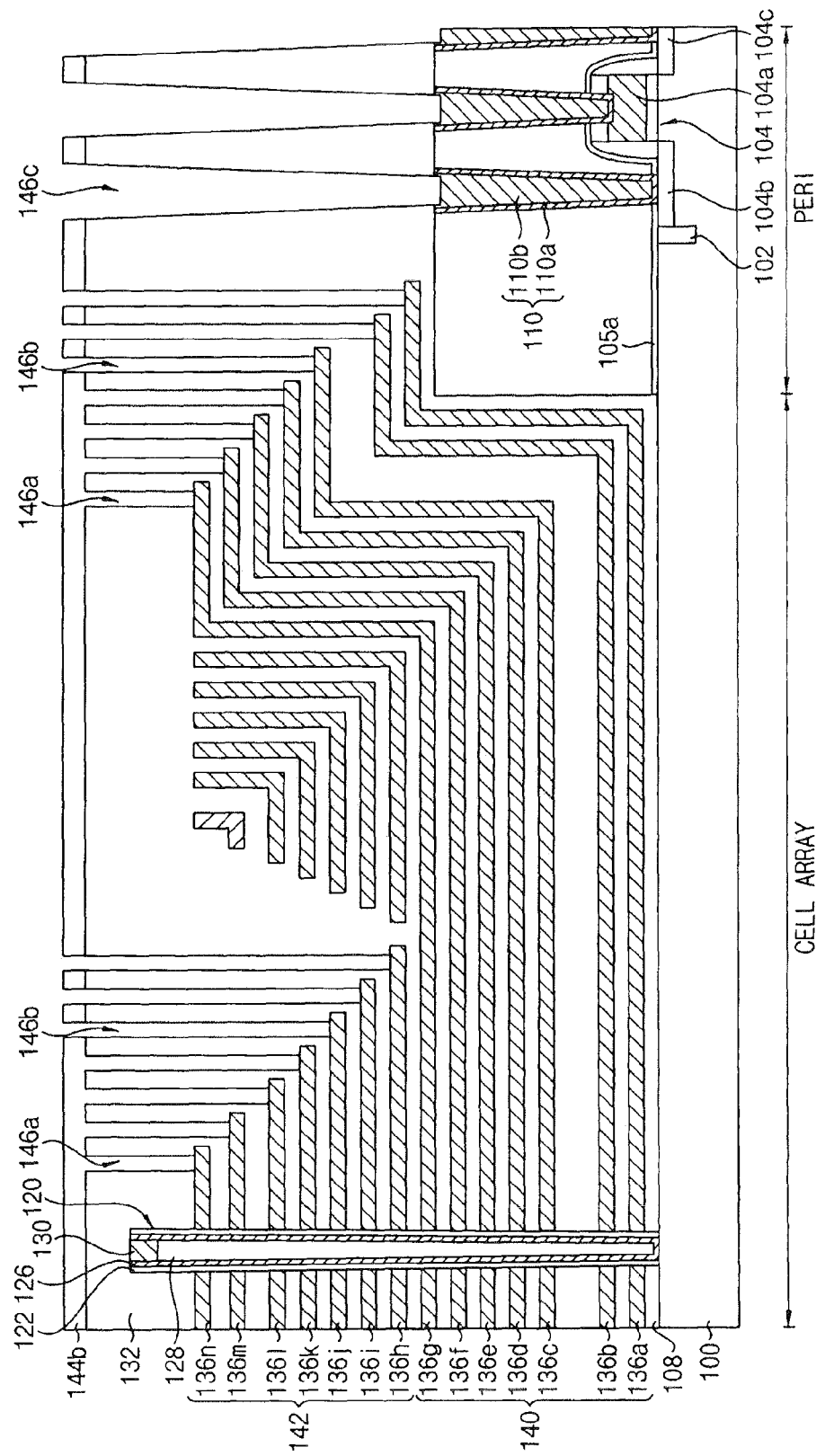

Referring to FIG. 4H, a first etching mask pattern 144a is formed on the upper insulating interlayer 132. The first etching mask pattern 144a may be a photoresist pattern formed through a photo process.

The first etching mask pattern 144a is used to form second contact holes 146a in the first and second group word lines 140 and 142 located at the upper position.

The upper insulating interlayer 132 is etched by using the first etching mask pattern 144a to form the second contact holes 146a exposing edge portions of the first and second group word lines 140 and 142 located at the upper position. As shown in FIG. 3B, the third metal layer 135b included in each of the first and second group word lines 140 and 142 is exposed through the second contact holes 146a.

Referring to FIG. 4I, a second etching mask pattern 144b is formed on the upper insulating interlayer 132. The second etching mask pattern 144b may be a photoresist pattern formed through a photo process.

The second etching mask pattern 144b is used to form third contact holes 146b exposing the first and second group word lines 140 and 142 located at the lower position and fourth contact holes 146c to the top surface of the first contact plug 110.

Then, the upper insulating interlayer 132 is etched by using the second etching mask pattern 144b to thus form the third contact holes 146b exposing lower portions of the first and second group word lines 140 and 142. The fourth contact holes 146c exposing the top surface of the first contact plug 110 in the peripheral circuit region PERI are formed through an etching process. The third contact holes 146b to form connection wires of the memory cells and the fourth contact holes 146c to form connection wires of the peripheral circuit region PERI can be simultaneously formed through a photolithography process.

As shown in FIG. 3B, the third metal layer 135b included in the first and second group word lines 140 and 142 is exposed through the third contact holes 146b.

According to an exemplary embodiment of the inventive concept, the second and third contact holes 146a and 146b are formed by performing a photolithography process two times. Alternatively, when the number of the first and second group word lines 140 and 142 is reduced, the second and third contact holes 146a and 146b can be formed by performing the photolithography process one time, and when the number of the first and second group word lines 140 and 142 is increased, the second and third contact holes 146a and 146b can be formed by performing the photolithography process at least two times.

As described above, the fourth contact holes 146c to form the connection wires of the peripheral circuits can be simultaneously formed when the photolithography process is performed to form the third contact holes 146b for exposing the first and second group word lines 140 and 142. Therefore, an additional photolithography process to form the fourth contact holes 146c may not be needed. The fourth contact holes 146c formed in the peripheral circuit region PERI extend to the top surface of the first contact plug 110 that has been previously formed but do not extend to the surface of the substrate 100. Thus, the depth of the fourth contact holes 146c is not significantly different from the depth of the second and third contact holes 146a and 146b exposing the first and second group word lines 140 and 142. Therefore, the fourth contact holes 146c can be simultaneously formed when the photolithography process is performed to form the second and third contact holes 146a and 16b for exposing the first and second group word lines 140 and 142 without performing an additional photolithography process to form the fourth contact holes 146c.

Figure 4J:
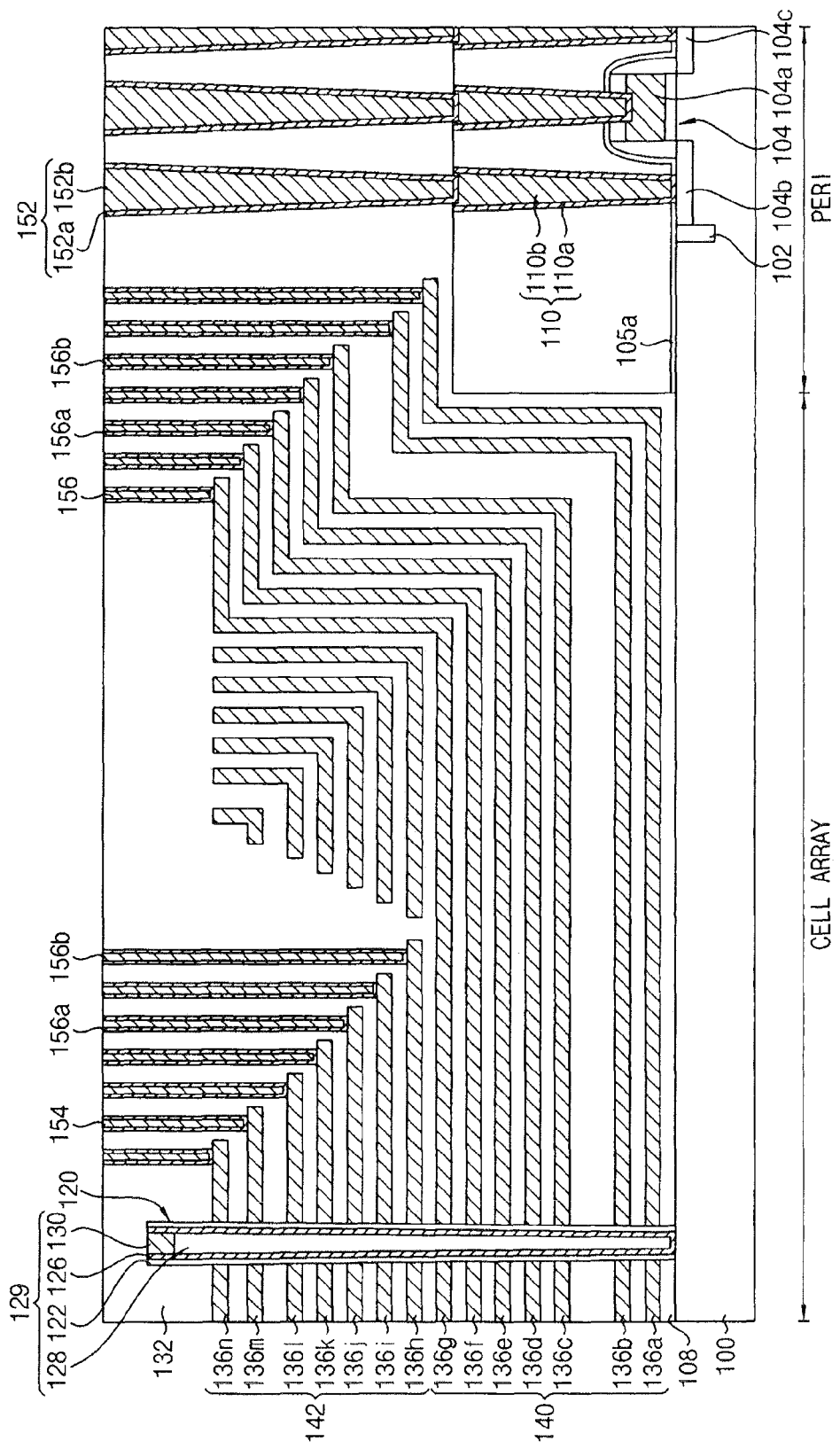

Referring to FIG. 4J, a conductive layer is formed in the second to fourth contact holes 146a, 146b and 146c to form the first word line contacts 154, the second word line contacts 156 and the second contact plug 152, respectively.

A barrier metal layer is formed along the surfaces of the second to fourth contact holes 146a, 146b and 146c. Then, a metal layer is formed on the barrier metal layer to fill the second to fourth contact holes 146a, 146b and 146c. Thereafter, a chemical mechanical polishing process is performed to remove the metal layer and the barrier metal layer, thereby exposing the surface of the upper insulating interlayer 132. The barrier metal layer may include titanium, titanium nitride, tantalum and/or tantalum nitride. The metal layer may include tungsten, copper and/or aluminum. The second contact plug 152 includes the second barrier metal layer 152a and the second metal layer 152b. The first and second word line contacts 154 and 156 each include the fourth barrier metal layer 156a and the fourth metal layer 156b.

Since the first and second word line contacts 154 and 156 and the second contact plug 152 are formed through substantially the same deposition process, the first and second word line contacts 154 and 156 and the second contact plug 152 include substantially the same material. The first and second word line contacts 154 and 156 and the second contact plug 152 include the barrier metal layer and the metal layer formed by using substantially the same material.

In accordance with an exemplary embodiment of the present inventive concept, the contacts functioning as wires of the peripheral circuits each have a stack structure in which the first and second contact plugs 110 and 152 are stacked in the vertical direction. Thus, the height of each contact plug 110 and 152 is smaller compared with the pillar structure 129, and accordingly, the substrate 100 may be prevented from being accidently etched or insufficiently exposed, as well as shorted.

Figure 5:
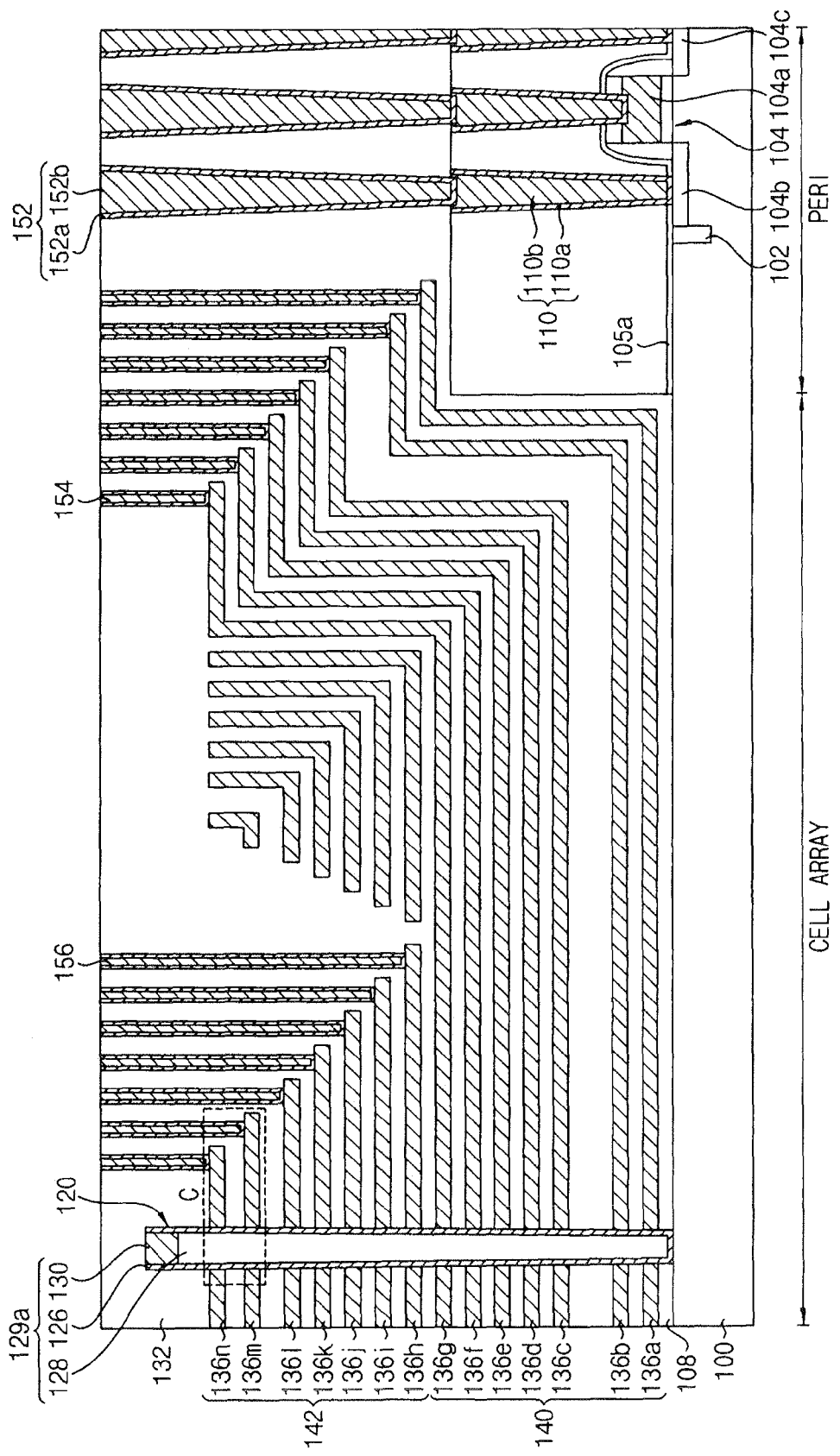
FIG. 5 is a sectional view illustrating a vertical type semiconductor device in accordance with an exemplary embodiment of the inventive concept.
Figure 6:
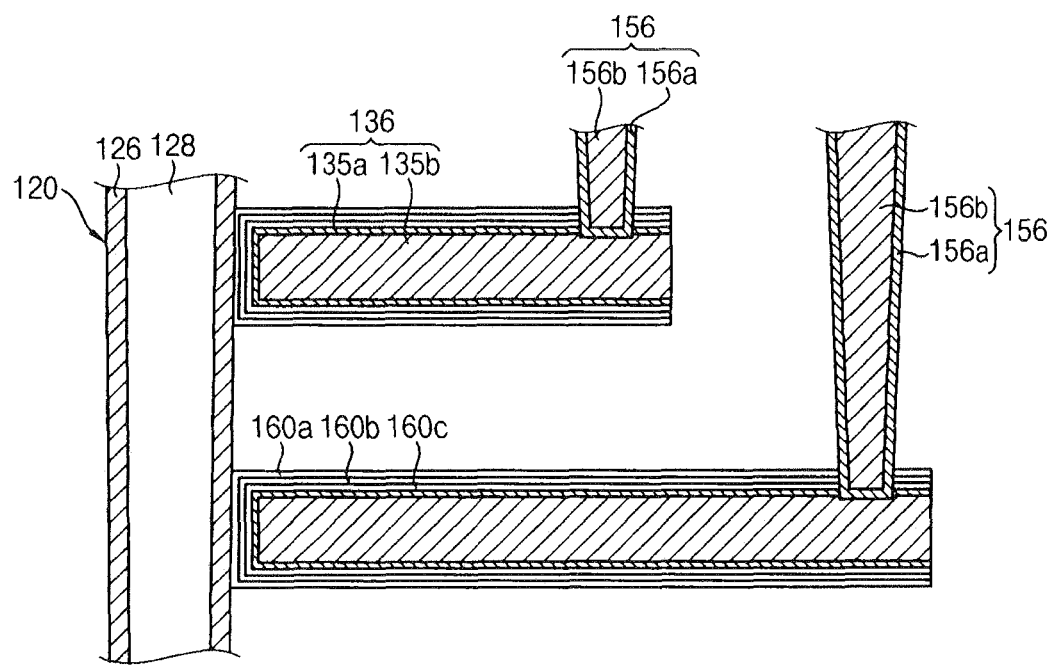
FIG. 6 is an enlarged view of portion 'C' shown in FIG. 5 according to an exemplary embodiment of the present inventive concept.

FIG. 5 is a sectional view illustrating a vertical type semiconductor device in accordance with an exemplary embodiment of the inventive concept. FIG. 6 is an enlarged view of portion 'C' shown in FIG. 5.

In a vertical type semiconductor device according to an exemplary embodiment of the inventive concept, the first and second word line contacts connected to the memory cells and the first and second contact plugs connected to the peripheral circuits are substantially the same as those of the vertical type semiconductor device described above in connection with FIGS. 1 to 4.

Referring to FIG. 5, pillar structures 129a protruding in the vertical direction are provided on the substrate 100 of the cell block area. The pillar structure 129a may be formed by stacking the channel pattern 126 in the lateral direction of the buried insulating layer pattern 128 having a cylindrical shape. The bottom surface of the channel pattern 126 contacts the substrate 100. The buried insulating layer pattern 128 may include silicon oxide. The channel pattern 126 may include silicon.

The gate structures including the word lines 140 and 142 are stacked on the substrate 100 while being spaced apart from each other by a predetermined distance. The word lines 140 and 142 are penetrated by the pillar structure 129a. Insulating layer patterns 108 are provided between the gate structures and insulate the gate structures from each other. The gate structures may have a line shape extending in a direction while surrounding the pillar structures 129a. FIG. 5 illustrates an example where only the word lines 140 and 142 are included in the gate structures. However, the cross section of the gate structure may have a shape as shown in FIG. 6.

Referring to FIG. 6, the gate structure has a stack structure of a tunnel insulating layer pattern 160a, a charge trap layer pattern 160b, a dielectric layer pattern 160c and a word line 136. The tunnel insulating layer pattern 160a is provided along the profile of the bottom surface of the upper insulating layer pattern 108, the surface of the channel pattern 126, and the top surface of the lower insulating layer pattern 108. The charge trap layer pattern 160b and the dielectric layer pattern 160c are provided along the surface profile of the tunnel insulating layer pattern 160a.

The tunnel insulating layer pattern 160a may include silicon oxide. The charge trap layer pattern 160b may include silicon nitride. The dielectric layer pattern 160c may include a first dielectric layer pattern and a second dielectric layer pattern having a dielectric constant higher than that of the first dielectric layer pattern. The first dielectric layer pattern may include silicon oxide. The second dielectric layer pattern may include metal oxide. Examples of the metal oxide used for the second dielectric layer pattern may include aluminum oxide, hafnium oxide, lanthanum oxide, lanthanum aluminum oxide, lanthanum hafnium oxide, hafnium aluminum oxide, titanium oxide, tantalum oxide, and/or zirconium oxide. These materials may be used alone or in a combination thereof. The word line 136 includes a third barrier metal layer 135a and a third metal layer 135b.

The first and second word line contacts 154 and 156 connected to the word lines 140 and 142 may have a structure substantially the same as the first and second word line contacts 154 and 156 described above in connection with FIGS. 1 to 4. The first and second word line contacts 154 and 156 contact the third metal layer 135b of the word lines 140 and 142.

The first and second contact plugs 110 and 152 formed in the peripheral circuit region PERI may have the structure substantially the same as the first and second contact plugs 110 and 152 described above in connection with FIGS. 1 to 4.

The vertical type semiconductor device according to an exemplary embodiment of the inventive concept can prevent the substrate 100 from being accidentally etched, insufficiently exposed or shorted when the contacts for the peripheral circuits are formed.

Figure 7:
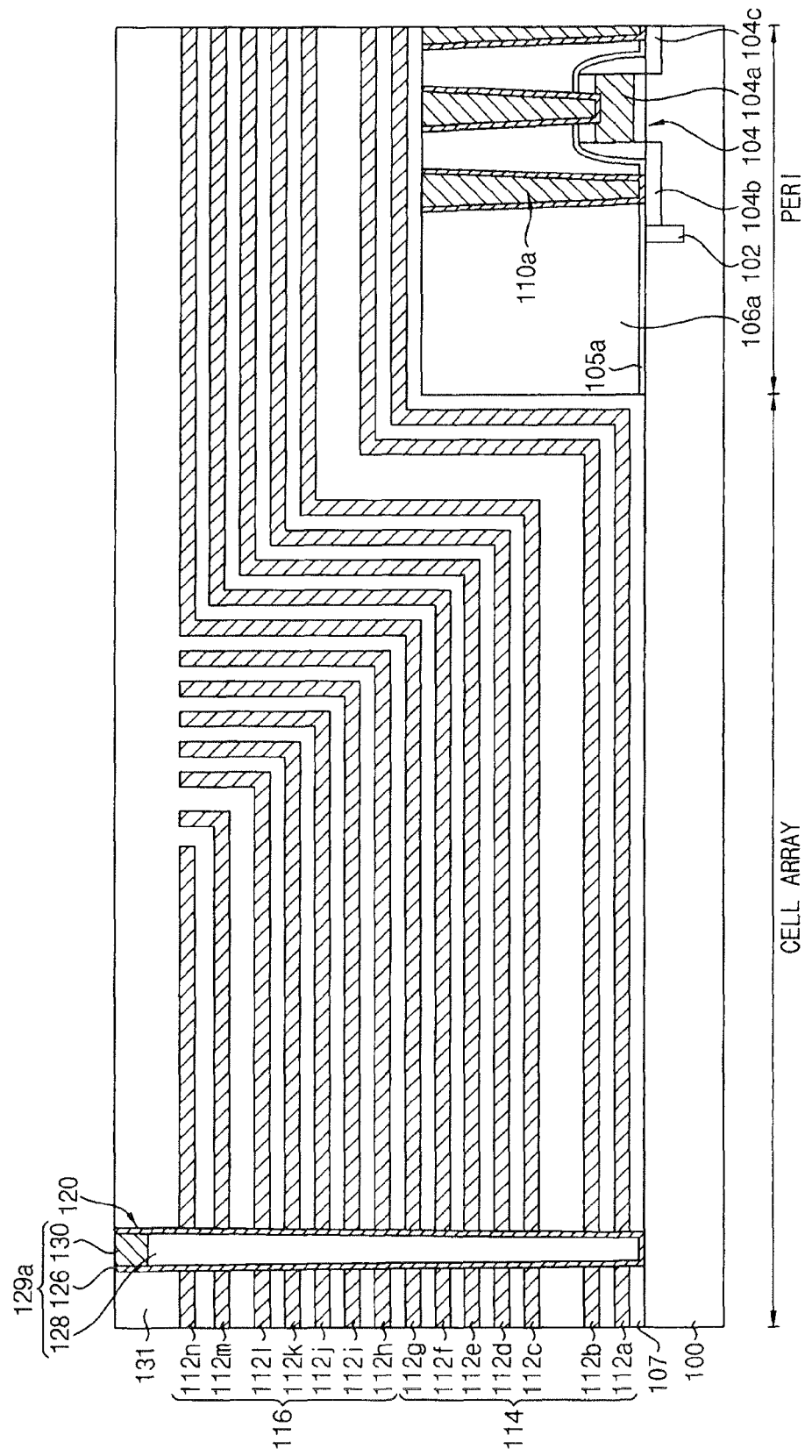
FIG. 7 is a sectional view illustrating a method of manufacturing a vertical type semiconductor device shown in FIG. 5 according to an exemplary embodiment of the present inventive concept.

FIG. 7 is a sectional view illustrating a method of manufacturing the vertical type semiconductor device shown in FIG. 5 according to an exemplary embodiment of the present inventive concept.

The vertical type semiconductor device shown in FIG. 5 is substantially identical to the vertical type semiconductor device described above in connection with FIGS. 1 to 4 except for the structure of the memory cells stacked in the cell block area. Thus, substantially the same manufacturing process described above in connection with FIGS. 1 to 4 may apply except for forming the memory cells.

The structure shown in FIG. 4D is formed by performing the process described with reference to FIGS. 4A to 4D.

Referring to FIG. 7, the insulating interlayer 131 covers the structure shown in FIG. 4D. Then, channel holes 120 for exposing the substrate 100 are formed in the cell block area by etching the insulating interlayer 131, the sacrificial layers 114 and 116 and the insulating layers 107. A selective epitaxial process may be further performed forming a semiconductor pattern that partially fills a lower portion of the channel holes 120.

Thereafter, the channel pattern 126 is formed along the sidewall of the channel holes 120 and the surface of the substrate 100. The channel pattern 126 may include a silicon layer. The buried insulating layer pattern 128, which may completely fills the channel hole 120, is formed on the channel pattern 126. The conductive pattern 130 electrically connected to the channel pattern 126 is formed on the buried insulating layer pattern 128. The conductive pattern 130 is configured to block an inlet of the channel hole 120. Therefore, the pillar structures 129a are formed.

Thereafter, edge portions of the sacrificial layers and insulating layers are etched forming the sacrificial layer patterns and the insulating layer pattern having step-shaped edge portions. The sacrificial layer patterns and the insulating layer pattern have a shape substantially identical to the shape shown in FIG. 4F.

Next, parts of the insulating layer patterns and the sacrificial layer patterns are subjected to a dry etching process forming the second opening (not shown). The second opening may have a trench shape extending in the extension direction of the word line. Then, the sacrificial layer patterns exposed to the sidewall of the second opening are removed forming recesses between the insulating layer patterns 108.

As shown in FIG. 6, the tunnel insulating layer pattern 160a, the trap insulating layer pattern 160b and the dielectric layer pattern 160c are conformally formed along the surfaces of the insulating layer pattern and the channel pattern 126 exposed to the inner wall of the recess. The word line layer is formed on the dielectric layer filling the recess. The word line layer may include the third barrier metal layer 135a and the third metal layer 135b. The word line layer is etched such that the word line layer is separated for each layer, thereby forming the word lines 136. The word line includes the third barrier metal layer 135a and the third metal layer 135b. Therefore, the first group word lines 140 and the second group word lines 142 are formed.

Subsequently, the process described above with reference to FIGS. 4H to 4J is performed, thereby forming the vertical type semiconductor device shown in FIG. 5.

Accordingly, the substrate 100 may be prevented from being accidentally etched, insufficiently exposed, or shorted when the contacts for the peripheral circuits are formed, can be reduced.

Figure 8:
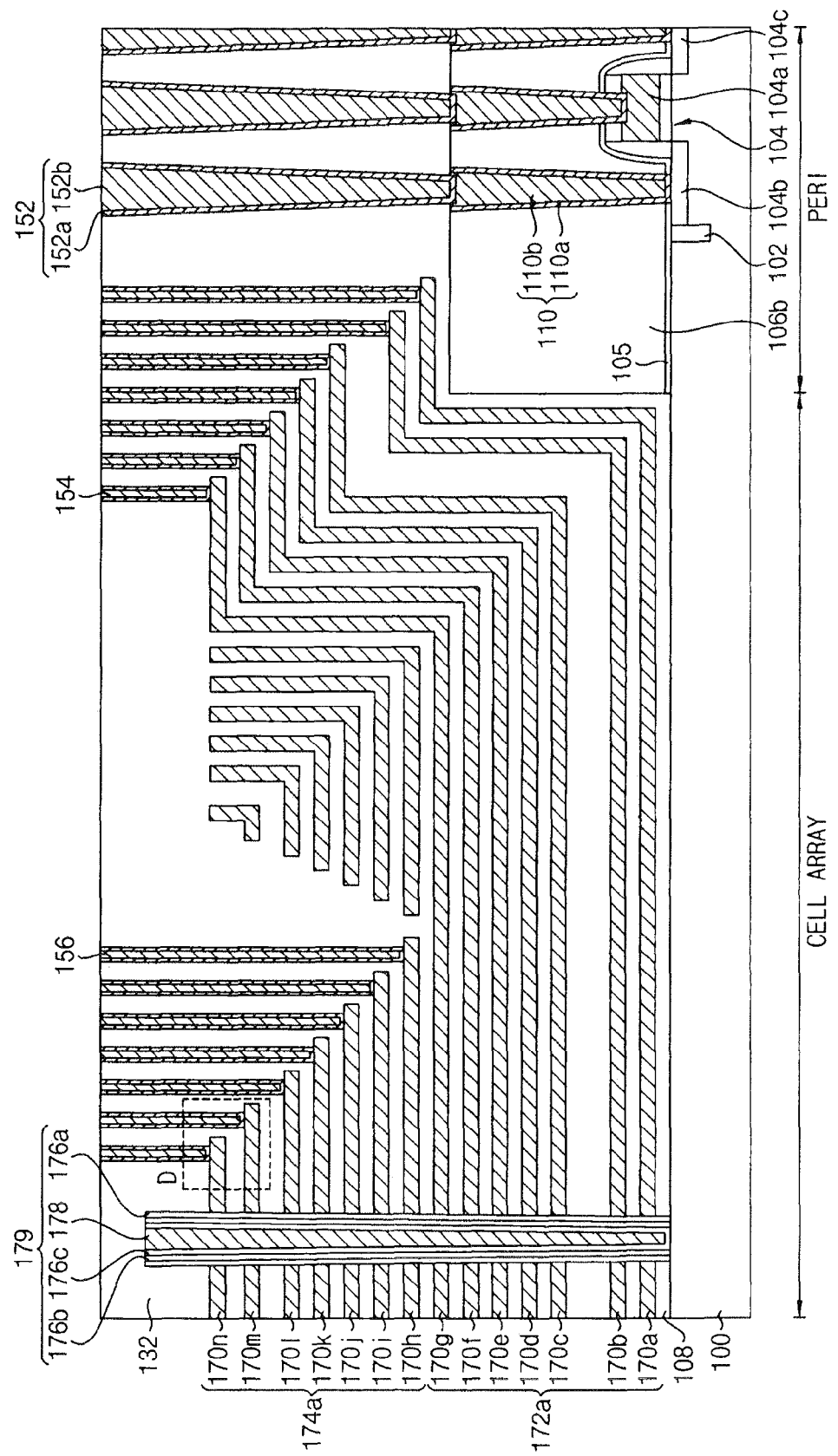
FIG. 8 is a sectional view illustrating a vertical type semiconductor device in accordance with an exemplary embodiment of the inventive concept.
Figure 9:
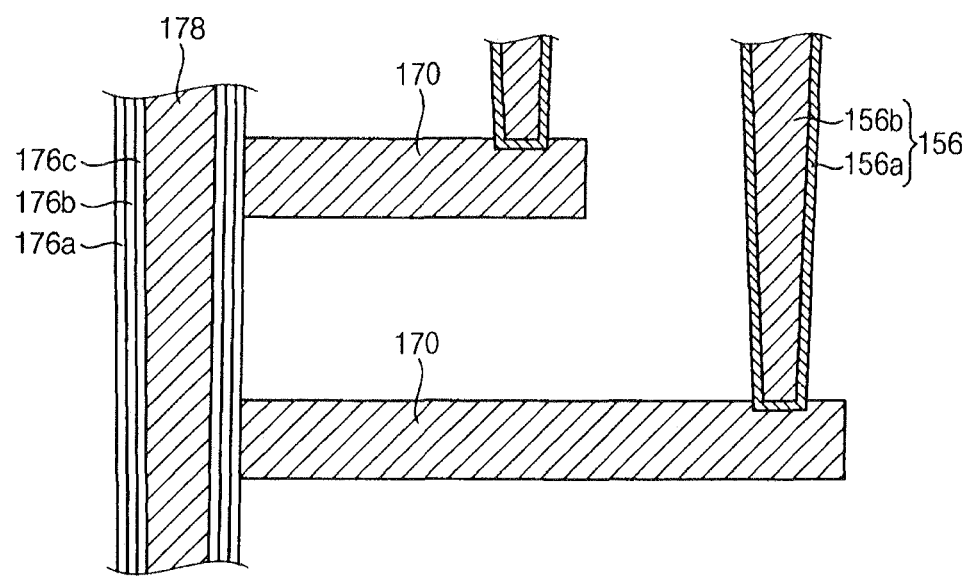
FIG. 9 is an enlarged view of portion 'D' shown in FIG. 8 according to an exemplary embodiment of the present inventive concept.

FIG. 8 is a sectional view illustrating a vertical type semiconductor device in accordance with an exemplary embodiment of the inventive concept. FIG. 9 is an enlarged view of portion 'D' shown in FIG. 8.

The vertical type semiconductor device according to an exemplary embodiment of the inventive concept is substantially identical to the vertical type semiconductor device described above in connection with FIGS. 1 to 4 except for the structure of the memory cells stacked in the cell block area. For example, the first and second word line contacts connected to the memory cells and the first and second contact plugs connected to the peripheral circuits are substantially identical to those of the vertical type semiconductor device described above in connection with FIGS. 1 to 4.

Referring to FIGS. 8 and 9, pillar structures 179 protruding in the vertical direction are provided on the substrate 100 of the cell block area. The pillar structure 179 may include a channel pattern 178 and a tunnel insulating layer pattern 176c, a charge trap layer pattern 176b and a dielectric layer pattern 176a, which are sequentially stacked in the lateral direction of the channel pattern 178. The channel pattern 178 contacts the substrate 100.

As shown in FIGS. 8 and 9, the channel pattern 178 may have a cylindrical shape. The channel pattern 178 may have a cylinder shape. When the channel pattern 178 has a cylinder shape, a buried insulating pattern may be further provided filling the cylinder.

Word lines 172a and 174a are stacked on the substrate 100 while being spaced apart from each other by a predetermined distance. The word lines 172a and 174a are penetrated by the pillar structure 179. The insulating layer patterns 108 are provided between the word lines 172a and 174a and insulate the word lines 172a and 174a from each other. The word lines 172a and 174a prepared in the layered structure may extend to the connection area while surrounding the pillar structures.

The word lines 172a and 174a include polysilicon. According to an exemplary embodiment, the word lines 172a and 174a may not include metals. The word lines 172a and 174a may not be cut for each pillar structure. For example, the word lines 172a and 174a each may surround the pillar structures that are included in of the cell blocks, respectively.

The word line contacts 154 and 156 are electrically connected to the word lines 172a and 174a, respectively. The word line contacts 154 and 156 each may include barrier metal layers 156a and metal layers 156b. The word line contacts 154 and 156 contact the polysilicon constituting the word lines 172a and 174a.

As described above in connection with FIGS. 1 to 4, first and second contact plugs 110 and 152 connected to the peripheral circuits are provided in the peripheral circuit region PERI.

In the vertical type semiconductor device according to an exemplary embodiment of the inventive concept, the height of each contact plug is smaller compared with the pillar structure, and thus, the substrate 100 may be prevented from being accidentally etched, insufficiently exposed or shorted when the contacts are formed in the peripheral circuits.

Figure 10A:
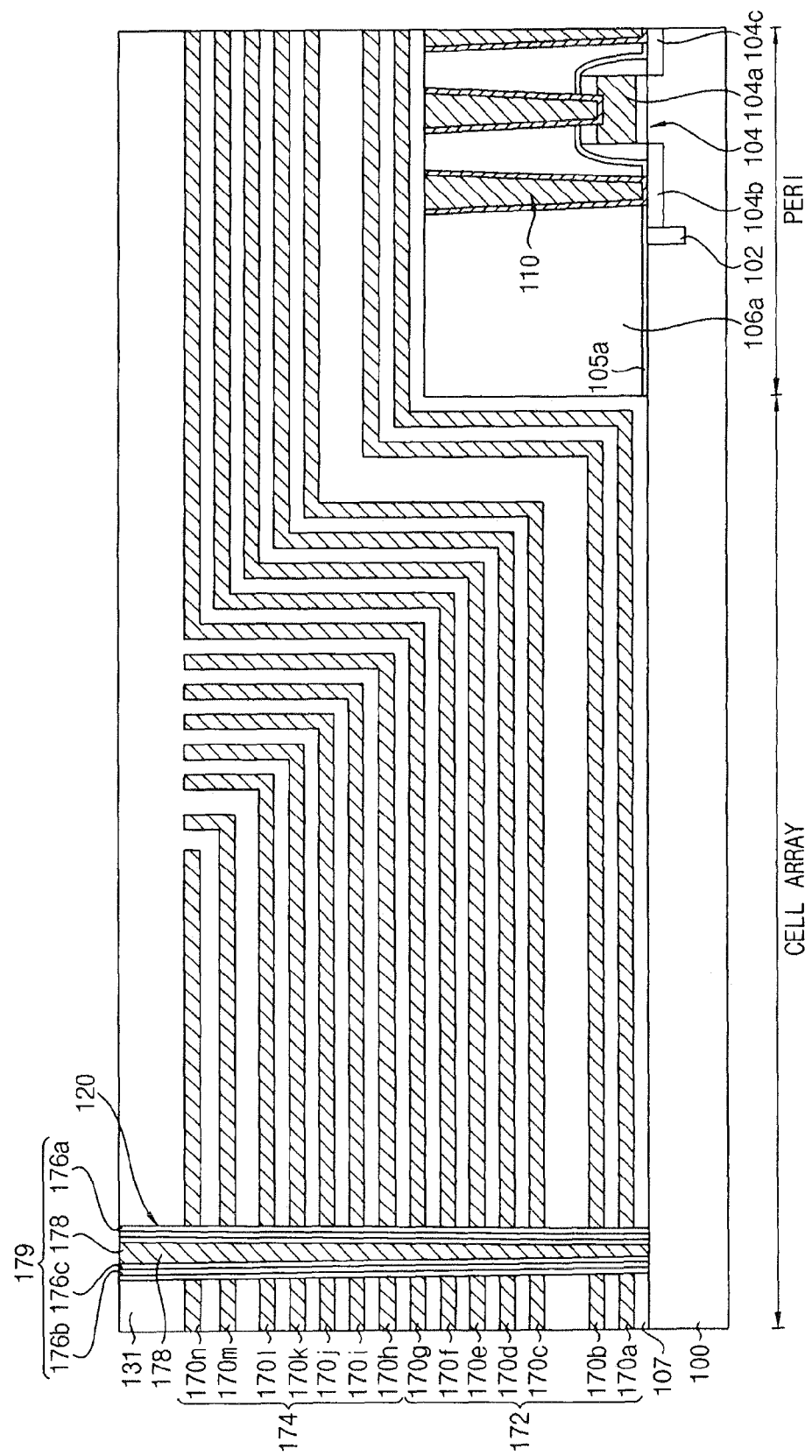
FIGS. 10A to 10C are sectional views illustrating a method of manufacturing a vertical type semiconductor device shown in FIG. 8 according to an exemplary embodiment of the present inventive concept.
Figure 10B:
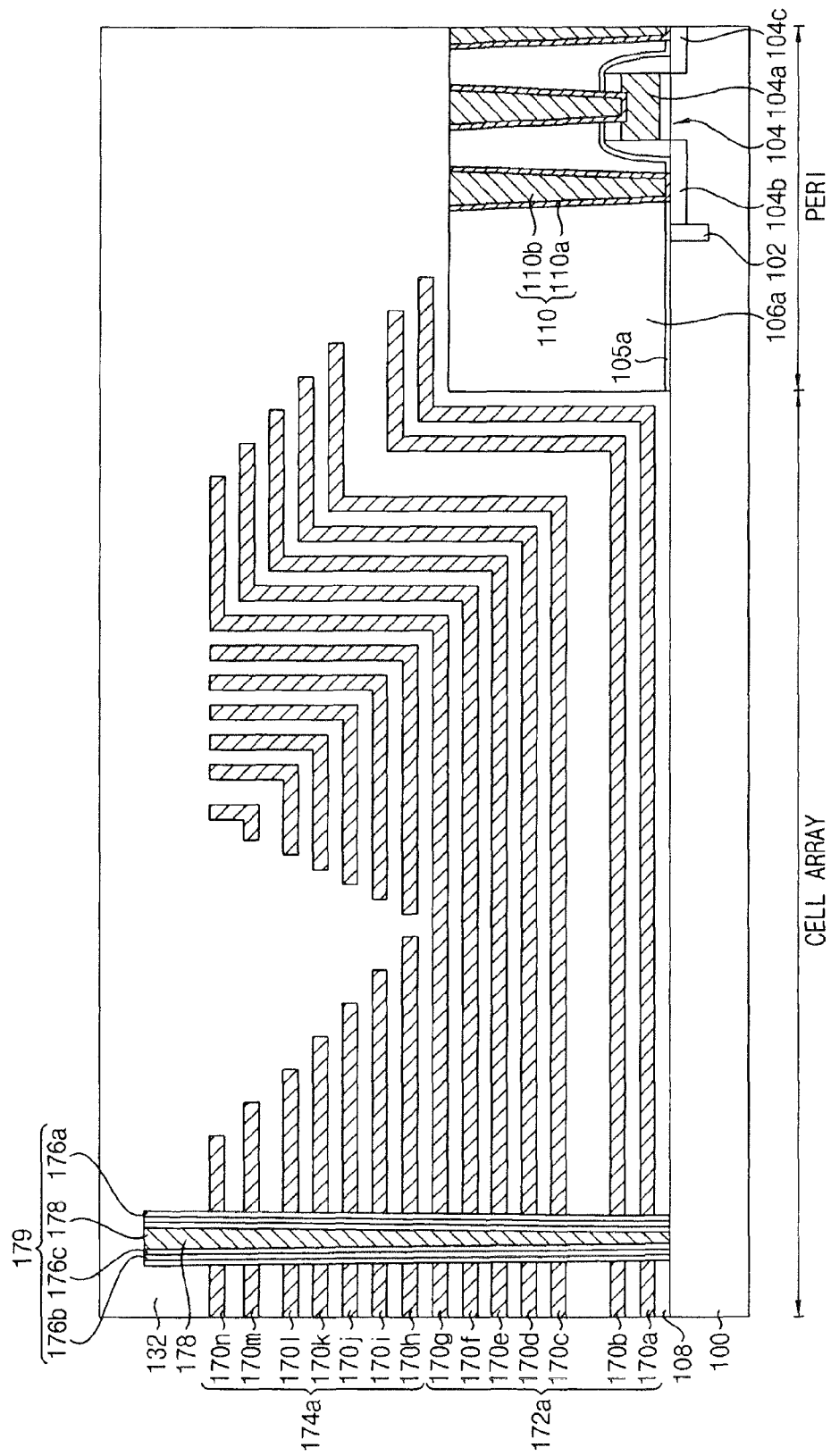
Figure 10C:
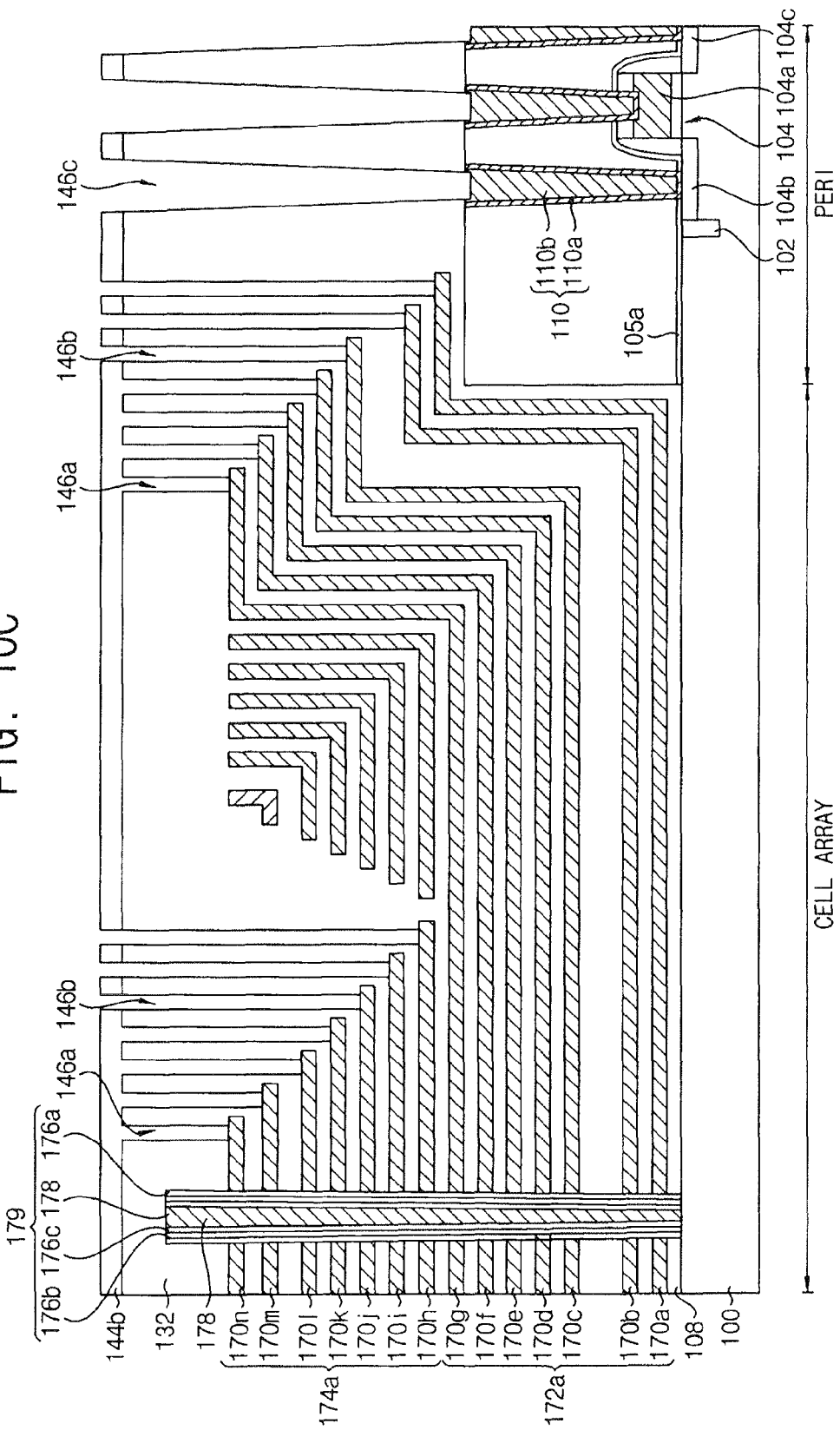

FIGS. 10A to 10C are sectional views illustrating a method of manufacturing the vertical type semiconductor device shown in FIG. 8 according to an exemplary embodiment of the present inventive concept.

The vertical type semiconductor device shown in FIG. 8 is substantially identical to the vertical type semiconductor device described above in connection with FIGS. 1 to 4 except for the structure of the memory cells stacked in the cell block area. Thus, substantially the same method as described above in connection with FIGS. 1 to 4 may apply except for forming the memory cells.

The structure shown in FIG. 4C is formed by performing the process that has been described with reference to FIGS. 4A to 4C.

Referring to FIG. 10A, the insulating layer 107 is formed along the surfaces of the substrate 100 of the cell array region and the first insulating interlayer pattern 106a. Polysilicon layers 172 and 174 are formed on the insulating layer 107. The polysilicon layers 172 and 174 may function as word line layers.

The insulating layers 107 and the polysilicon layers 172 and 174 are alternately and repeatedly stacked. The polysilicon layers 172 and 174 are processed as word lines in a subsequent process, and thus, the number of the polysilicon layers 172 and 174 may correspond to the number of memory cells which are vertically stacked.

Hereinafter, in the insulating layer 107 and the polysilicon layers 172 and 174, a section extending in the horizontal direction on the top surface of the substrate 100 will be referred to as a first section, a section extending in the vertical direction at the sidewall of the first insulating interlayer pattern 106a will be referred to as a second section, and a section extending in the horizontal direction on the top surface of the first insulating interlayer pattern 106a will be referred to as a third section. The insulating layers and the polysilicon layers located at an upper position will be referred to as second group insulating layers, and second group polysilicon layers 174, and the insulating layers and the polysilicon layers located at a lower position will be referred to as first group insulating layers and first group polysilicon layers 172.

Then, the upper portions of the insulating layers and the polysilicon layers 172 and 174 are subjected to a polishing process and thus are removed and/or rendered flat. The polishing process includes a chemical mechanical polishing process. The polishing process is adjusted such that the first group insulating layers and the first group polysilicon layers 172 each may include the first to third sections and the second group insulating layers and the second group polysilicon layers 174 each may include only the first and second sections.

Then, the insulating interlayer 131 covers the uppermost layer, e.g., the second group polysilicon layer 170n.

Thereafter, channel holes 120 for exposing the surface of the substrate 100 are formed in the cell block area by etching the insulating interlayer 131, the polysilicon layers 172 and 174 and the insulating layers 107.

Then, the dielectric layer, the charge trap layer and the tunnel insulating layer are formed along the sidewall of the channel holes 120 and the surface of the substrate 100. Thereafter, the dielectric layer pattern 176a, the charge trap layer pattern 176b and the tunnel insulating layer pattern 176c having a spacer shape are formed at the sidewall of the channel holes 120 by anisotropically etching the dielectric layer, the charge trap layer and the tunnel insulating layer. Due to the etching process, the surface of the substrate 100 is exposed to the channel hole 120.

The channel pattern 178 is formed on the surfaces of the tunnel insulating layer pattern 176c and the substrate 100. The channel pattern 178 is configured to fill the channel hole 120. The channel pattern 178 may have a cylinder shape. In this case, an insulating pattern (not shown) may be further formed on the channel pattern 178. Therefore, the pillar structures 179 protruding from the substrate 100 of the cell block region in the vertical direction and including the channel pattern 178, the tunnel insulating layer pattern 176c, the charge trap layer pattern 176b and the dielectric layer pattern 176a, which are sequentially stacked, can be obtained.

According to an exemplary embodiment of the inventive concept, the pillar structures 179 are formed after the polysilicon layers 172 and 174 functioning as the word lines are formed.

Referring to FIG. 10B, edge portions of the insulating layers 107 and the polysilicon layers 172 and 174 are etched forming the insulating layer patterns 108 and the word lines 172a and 174a having step-shaped edge portions.

As the etching process is performed, the edge portions of the first group word lines 172a and the insulating layer pattern are each rendered to have a stepped shape. The edge portions of the first group word line 172a and the insulating layer patterns and the edge portions of the second group word line 174a and the insulating layer patterns are located higher than the top surface of the first insulating interlayer 106a.

Thereafter, the upper insulating interlayer 132 covers the first group word lines 172a and the insulating layer patterns and the second group word lines 174a and the insulating layer patterns.

Referring to FIG. 10C, the first etching mask pattern (not shown) is formed on the upper insulating interlayer 132. The first etching mask pattern may be a photoresist pattern formed through a photo process. The first etching mask pattern is used to form second contact holes leading to the first and second group word lines 172a and 174a located at the upper position.

The upper insulating interlayer 132 is etched by using the first etching mask pattern to form the second contact holes 146a exposing edge portions of the first and second group word lines 172a and 174a located at the upper position. The polysilicon included in the first and second group word lines 172a and 174a is exposed to the contact holes 146a.

The second etching mask pattern 144b is formed on the upper insulating interlayer 132. The second etching mask pattern 144b may be a photoresist pattern formed through a photo process.

The second etching mask pattern 144b is used to form third contact holes 146b in the first and second group word lines 172a and 174a located at the lower position and fourth contact holes 146c on the top surface of the first contact plug 110.

Then, the upper insulating interlayer 132 is etched by using the second etching mask pattern 144b to form the third contact holes 146b exposing edge portions of the first and second group word lines 172a and 174a located at the lower position. The fourth contact holes 146c for exposing the top surface of the first contact plug 110 of the peripheral circuit region PERI are formed through an etching process. The third contact holes 146b to form the connection wires of the memory cells and the fourth contact holes 146c to form the connection wires of the peripheral circuit region PERI can be simultaneously formed through a photolithography process.

Although the contact holes for exposing the first and second group word lines 172a and 174a are formed by performing the photolithography process two times, the exemplary embodiments of the inventive concept are not limited thereto. According to an exemplary embodiment of the inventive concept, the photolithography process may be carried out once or three or more times.

Referring back to FIGS. 8 and 9, a conductive layer is formed inside the second to fourth contact holes 146a, 146b and 146c to form the first word line contacts 154, the second word line contacts 156 and the second contact plug 152, respectively.

Since the first and second word line contacts 154 and 156 and the second contact plug 152 are formed through substantially the same deposition process, the first and second word line contacts 154 and 156 and the second contact plug 152 include substantially the same materials. For example, the first and second word line contacts 154 and 156 each may include a barrier metal layer pattern 156a and a metal layer pattern 156b, and the second contact plug 152 may include a barrier metal layer pattern 152a and a metal layer pattern 152b.

Therefore, the vertical type memory device according to an exemplary embodiment of the inventive concept can be obtained. The contacts functioning as wires for the peripheral circuits each have a stack structure in which the first and second contact plugs are stacked in the vertical direction. Thus, the height of each contact plug is smaller compared with the pillar structure, and thus, the substrate 100 may be prevented from being accidentally etched, insufficiently exposed, or shorted when the contacts are formed in the peripheral circuits.

Figure 11:
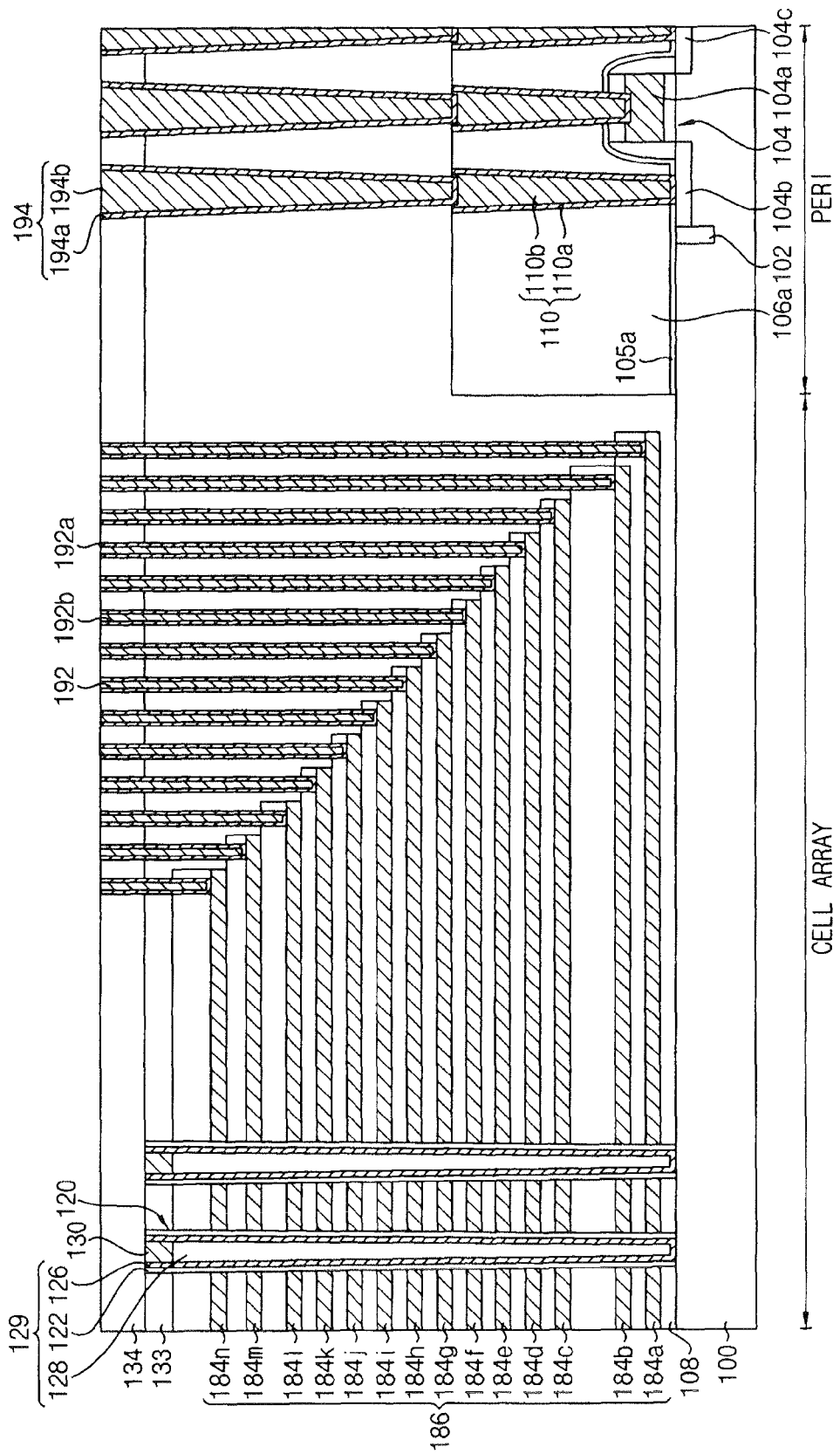
FIG. 11 is a sectional view illustrating a vertical type semiconductor device in accordance with an exemplary embodiment of the inventive concept.

FIG. 11 is a sectional view illustrating a vertical type semiconductor device in accordance with an exemplary embodiment of the inventive concept.

The vertical type semiconductor device according to the present exemplary embodiment is substantially identical to the vertical type semiconductor device described above in connection with FIGS. 1 to 4 except word lines which extend and serve as connection pads and the structure of wires connected to the connection pads.

Referring to FIG. 11, the MOS transistors 104 constituting peripheral circuits are provided in the substrate 100 of the peripheral circuit region PERI. A first insulating interlayer pattern 106a covers the MOS transistors 104. According to an exemplary embodiment of the inventive concept, the shape of word lines is not changed according to the height of the first insulating interlayer pattern 106a. The height of the first insulating interlayer pattern 106a is not limited by the word lines.

When the height of the first insulating interlayer pattern 106a is less than about 25% of the height of the pillar structure, the height of the first contact plug 110 is decreased, and the height of the second contact plug 194 is increased, and the second contact plug may not be properly formed. When the height of the first insulating interlayer pattern 106a is higher than about 65% of the height of the pillar structure, the height of the first contact plug 110 is increased, and thus, the effect of preventing the substrate recess may be reduced. Thus, the first insulating interlayer pattern 106a may have a height between about 25% and about 60% of the height of the pillar structure 129 formed in the cell array region.

Gate structures including word lines 186 are stacked, with the pillar structure 129 penetrating the word lines 186. The gate structures are spaced apart from each other by a predetermined interval. Insulating layer patterns 108 are provided between the gate structures and insulate the gate structures from each other. The gate structures may have a line shape extending in one direction while surrounding the pillar structures.

In FIG. 11, the gate structures include only the word lines 186. However, the gate structures each may have a shape cross-sectioned as shown in FIG. 3B.

As shown in FIG. 3B, the gate structure has a stack structure of a second dielectric layer pattern and a word line. The stack structure is identical or substantially identical to the stack structure of the gate structure described above in connection with FIGS. 1 to 4.

The word lines 186 provided in the cell block area are configured to continuously extend to the connection area. The length of a word line 186 located at a lower position is longer than the length of a word line 186 located at an upper position. Thus, the edge portions of the word lines 186 formed in the connection area form a stepped shape. The top surfaces of the edge portions of the word lines 186 may function as pad portions. As shown in FIG. 11, the word lines 186 do not extend to the first insulating interlayer pattern 106a covering the peripheral circuit region PERI and need not be bent upward at the first insulating interlayer pattern 106a.

The insulating interlayer 133 and the upper insulating interlayer 134 cover the word lines 186.

Word line contacts 192 pass through the insulating layer 133 and the upper insulating layer 134 and contact the pad portions of the word lines 186. The word line contacts 192 directly contact the metal layers included in the word lines 186. Contact parts between the word line contacts 192 and the word lines 186 are substantially identical to the contact parts described above with reference to FIG. 3B.

The word line contact 192 includes a fourth barrier metal layer 192a and a fourth metal layer 192b. The fourth barrier metal layer 192a is provided along the sidewall and the bottom surface of the contact hole exposing the pad portion of the word lines 186. The fourth metal layer 192b is formed on the fourth barrier metal layer 192a and fills the contact hole.

The first and second contact plugs 110 and 194 functioning as contacts as described above in connection with FIGS. 1 to 4 are vertically stacked on the substrate 100 of the peripheral circuit region PERI. The second contact plug 194 includes a second barrier metal layer 194a and a second metal layer 194b.

The fourth barrier metal layer 192a included in the word line contact 192 may include a material substantially the same as the second barrier metal layer 194a included in the second contact plug 194. The fourth metal layer 192b included in the word line contact 192 may include a material substantially the same as the second metal layer 194b included in the second contact plug 194. The word line contacts 192 may be substantially simultaneously formed with the second contact plugs 194 through substantially the same process.

As shown in FIG. 1, the contact structures functioning as wires of the peripheral circuits each have a stack structure in which the first and second contact plugs 110 and 194 are stacked in the vertical direction. Thus, the height of each contact plugs 110 and 194 is smaller compared with the pillar structure, and thus, the substrate 100 may be prevented from being accidentally etched, insufficiently exposed, or shorted when the contacts are formed in the peripheral circuits.

FIGS. 12A to 12E are sectional views illustrating a method of manufacturing the vertical type semiconductor device shown in FIG. 11 according to an exemplary embodiment of the present inventive concept.

The vertical type semiconductor device shown in FIG. 11 is substantially identical to the vertical type semiconductor device shown in FIG. 1 except for the word lines that extend and serve as connection pads and the structure of wires connected to the connection pads.

The structure shown in FIG. 4C is formed by performing the process described above with reference to FIGS. 4A to 4C.

Referring to FIG. 12A, the insulating layer 107 is formed along the surfaces of the substrate 100 of the cell array region and the first insulating interlayer pattern 106a. A sacrificial layer 180 including a material having etching selectivity with respect to the insulating layer 107 is formed on the insulating layer 107. For instance, the insulating layer 107 may include silicon oxide, and the sacrificial layer 180 may include silicon nitride.

The insulating layers 107 and the sacrificial layers 180 are alternately and repeatedly stacked. At the region where the sacrificial layers 180 are formed, word lines are formed in a subsequent process. Thus, the number of the sacrificial layers 180 may correspond to the number of the memory cells which are vertically stacked. According to an exemplary embodiment of the inventive concept, no additional polishing process may be performed.

Figure 12B:
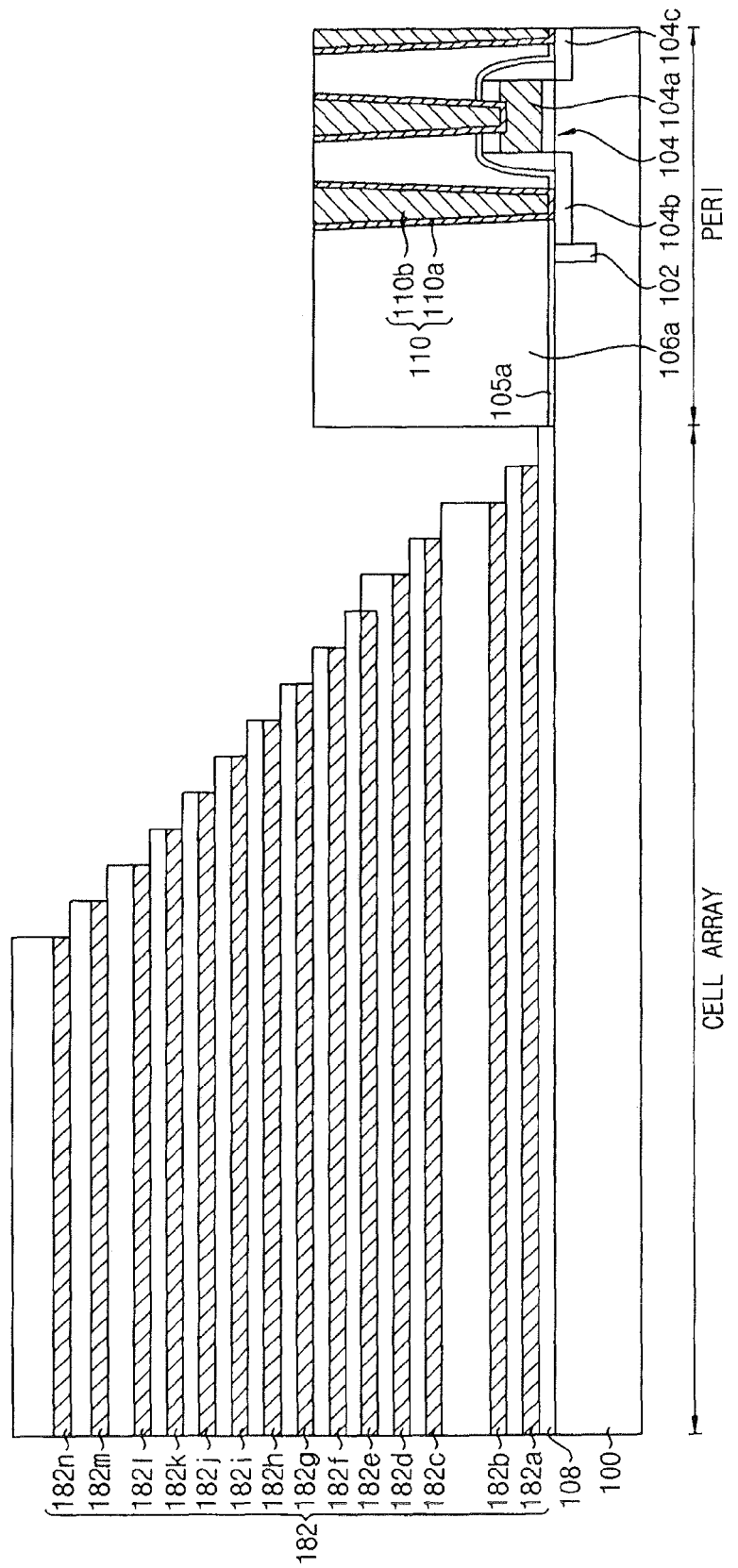

Referring to FIG. 12B, edge portions of the sacrificial layers and insulating layers are etched and thus are rendered to have a stepped structure.

The sacrificial layer patterns 182 and the insulating layer patterns 108 may not extend to the first insulating interlayer pattern 106a covering the peripheral circuit region PERI. Thus, the sacrificial layer patterns 182 and the insulating layer patterns 108 may not be bent upward at the first insulating interlayer pattern 106a. Edge portions of the lowermost sacrificial layer patterns 182 are located close to the surface of the substrate 100.

Figure 12C:
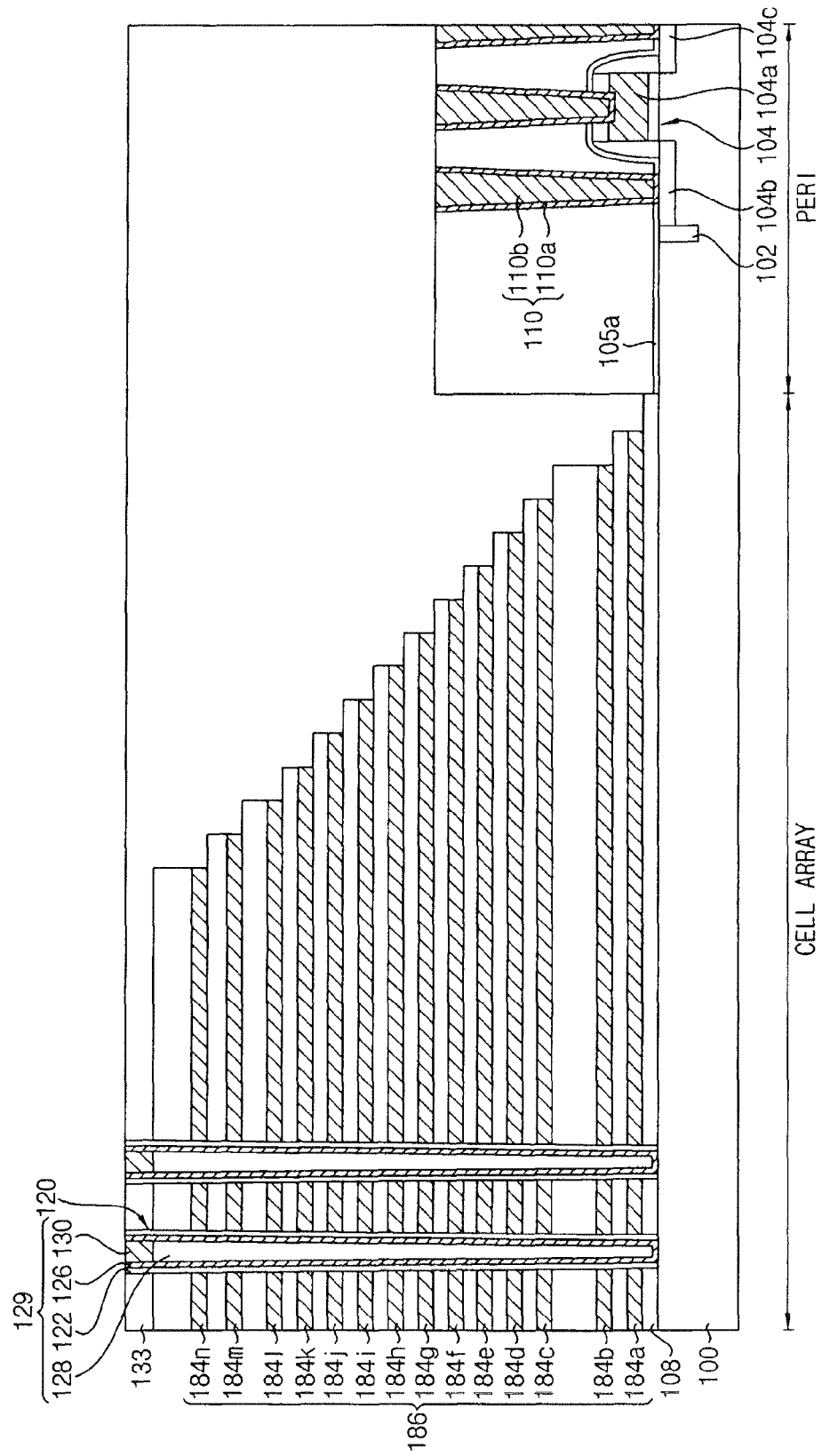

Referring to FIG. 12C, the insulating interlayer 133 covers the uppermost insulating layer pattern 108.

Then, channel holes 120 for exposing the surface of the substrate 100 are formed in the cell block area by etching the insulating interlayer 133, the sacrificial layer patterns 182 and the insulating layer patterns 108. Thereafter, the pillar structures 129 are formed in the channel holes 120 by performing the process described above with reference to FIG. 4E.

The sacrificial layer patterns 182 are removed, and the second dielectric layer patterns and the word lines 186 are formed in the spaces left by removing the sacrificial layer patterns 182. The process of removing the sacrificial layer patterns 182 and forming the second dielectric layer patterns and the word lines in the spaces is substantially identical to the process described above with reference to FIG. 4G Thus, as shown in FIG. 3B, the word lines 186 each including the third barrier metal pattern and the third metal pattern can be formed.

Referring to FIG. 12D, the upper insulating interlayer 134 is formed on the insulating interlayer 133. A first etching mask pattern 188a is formed on the upper insulating interlayer 134. The first etching mask pattern 188a may be a photoresist pattern formed through a photo process.

The first etching mask pattern 188a is used to form second contact holes in the first group word lines 186a located at the upper position.

The upper insulating interlayer 134 and the insulating interlayer 133 are etched by using the first etching mask pattern 188a, forming the second contact holes 190a exposing edge portions of the first group word lines 186a located at the upper position. The metal layer patterns included in the first group word lines 186a are exposed to the second contact holes 190a.

Figure 12E:
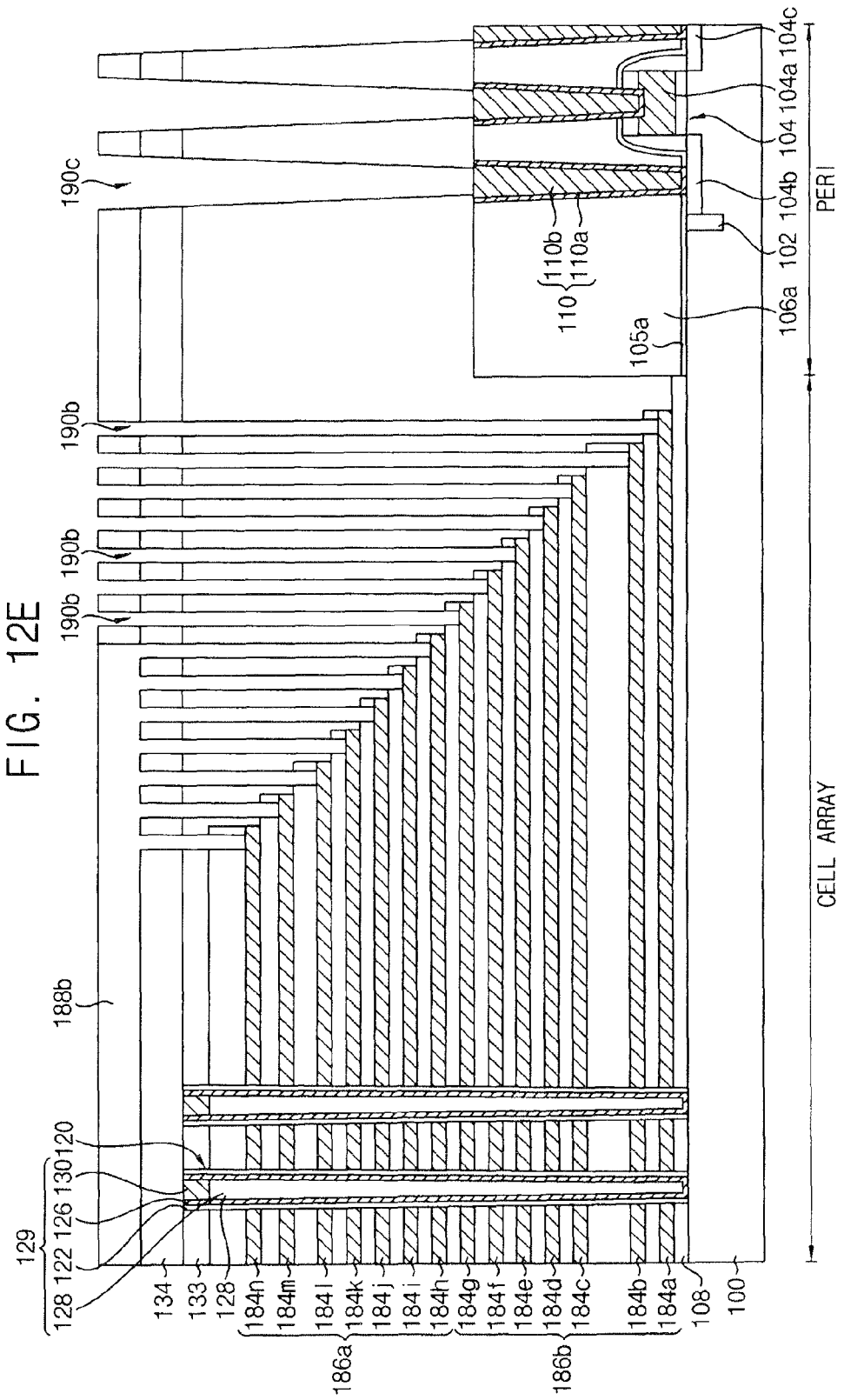

Referring to FIG. 12E, a second etching mask pattern 188b is formed on the upper insulating interlayer 134. The second etching mask pattern 188b may be a photoresist pattern formed through a photo process.

The second etching mask pattern 188b is used to form third contact holes in the second group word lines 186b located under the first group word lines 186a and to form fourth contact holes 190c on the top surface of the first contact plug 110.

Then, the upper insulating interlayer 134 and the insulating interlayer 133 are etched by using the second etching mask pattern 188b, forming the third contact holes 190b exposing edge portions of the second group word lines 186b. The fourth contact holes 190c for exposing the top surfaces of the first contact plugs 110 in the peripheral circuit region PERI are formed through an etching process. The third contact holes 190b to form the connection wires of the memory cells and the fourth contact holes 190c to form the connection wires of the peripheral circuit region PERI can be substantially simultaneously formed through a photolithography process.

According to an exemplary embodiment of the inventive concept, the second and third contact holes 190a and 190b are formed by performing a photolithography process two times. However, when the number of the word lines 186 is reduced, the second and third contact holes 190a and 190b can be formed by performing the photolithography process one time, when the number of the word lines is increased, the second and third contact holes can be formed by performing the photolithography process at least two times.

The fourth contact holes 190c for connection with the peripheral circuits can be substantially simultaneously formed when the photolithography process is performed to form the second and third contact holes 190a and 190b for exposing the first and second group word lines. Therefore, an additional photolithography process to form the fourth contact holes 190c may not be needed.

Referring back to FIG. 11, a conductive layer is formed in the second to fourth contact holes 190a, 190b and 190c to form the word line contacts 192 and the second contact plug 154.

Since the word line contacts 192 and the second contact plugs 194 are formed through substantially the same deposition process, the word line contacts 192 and the second contact plugs 194 may include substantially the same materials. For example, the word line contacts 192 and the second contact plugs 194 each include a barrier metal layer pattern and a metal layer pattern.

Therefore, the vertical type memory device according to an exemplary embodiment of the inventive concept can be obtained. The contacts functioning as wires for the peripheral circuits each have a stack structure in which the first and second contact plugs are stacked in the vertical direction. Thus, the height of each contact plug is smaller compared with the pillar structure, and thus, the substrate 100 may be prevented from being accidentally etched, insufficiently exposed, or shorted when the contacts are formed in the peripheral circuits.

The vertical type semiconductor device may have a different cell structure in the cell array region, with the word lines extending and functioning as connection pads connected to wires.

Figure 13:
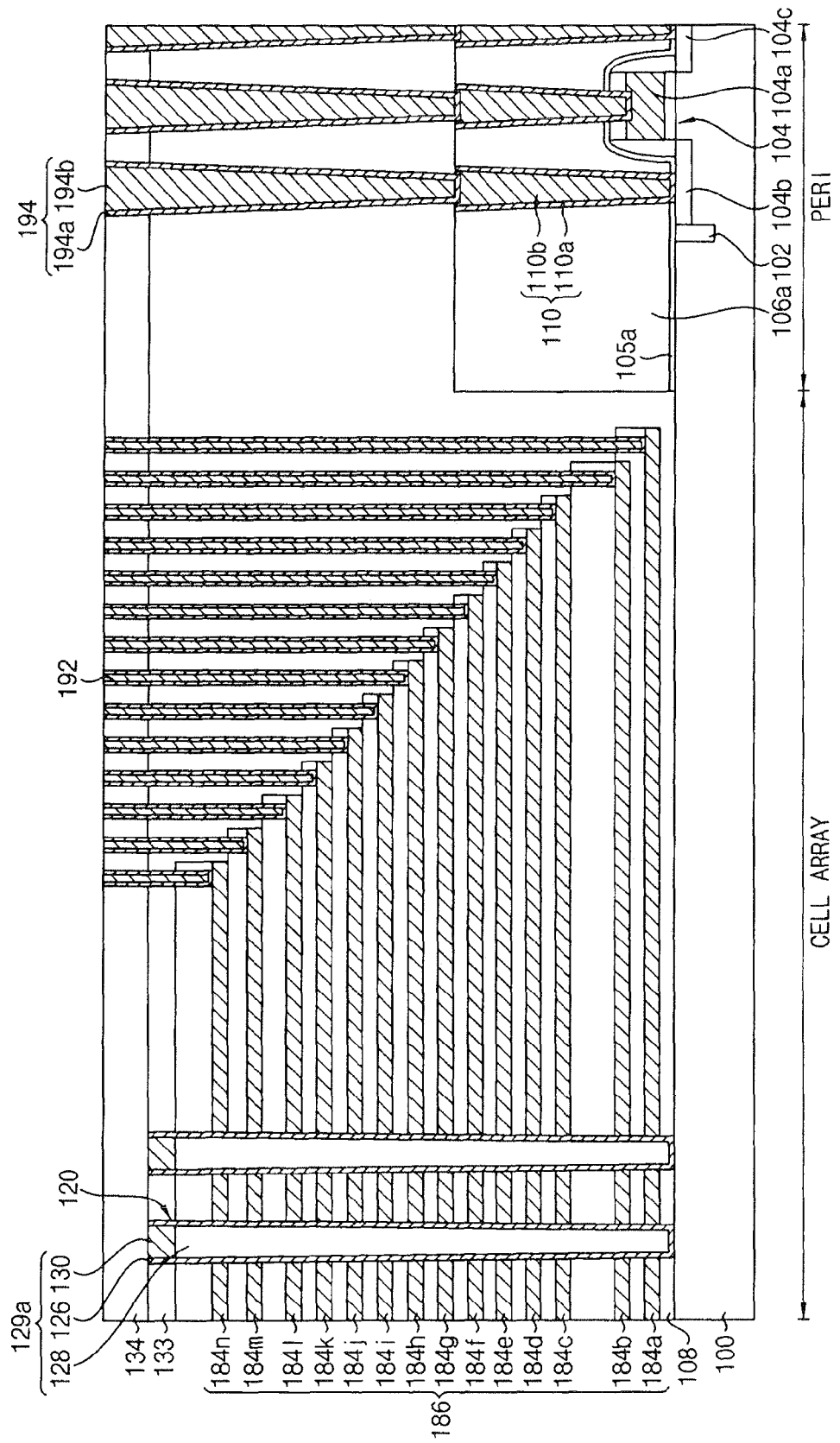
FIG. 13 is a sectional view illustrating a vertical type semiconductor device in accordance with an exemplary embodiment of the inventive concept.

FIG. 13 is a sectional view illustrating a vertical type semiconductor device in accordance with an exemplary embodiment of the inventive concept.

As shown in FIG. 13, the vertical type semiconductor device has a structure substantially identical to the structure of the vertical type semiconductor device described above in connection with FIGS. 5 to 7. In addition, the shape of the word lines and the word line pads and the connection structure to the word lines are substantially identical to those described above in connection with FIGS. 11 and 12.

Figure 14:
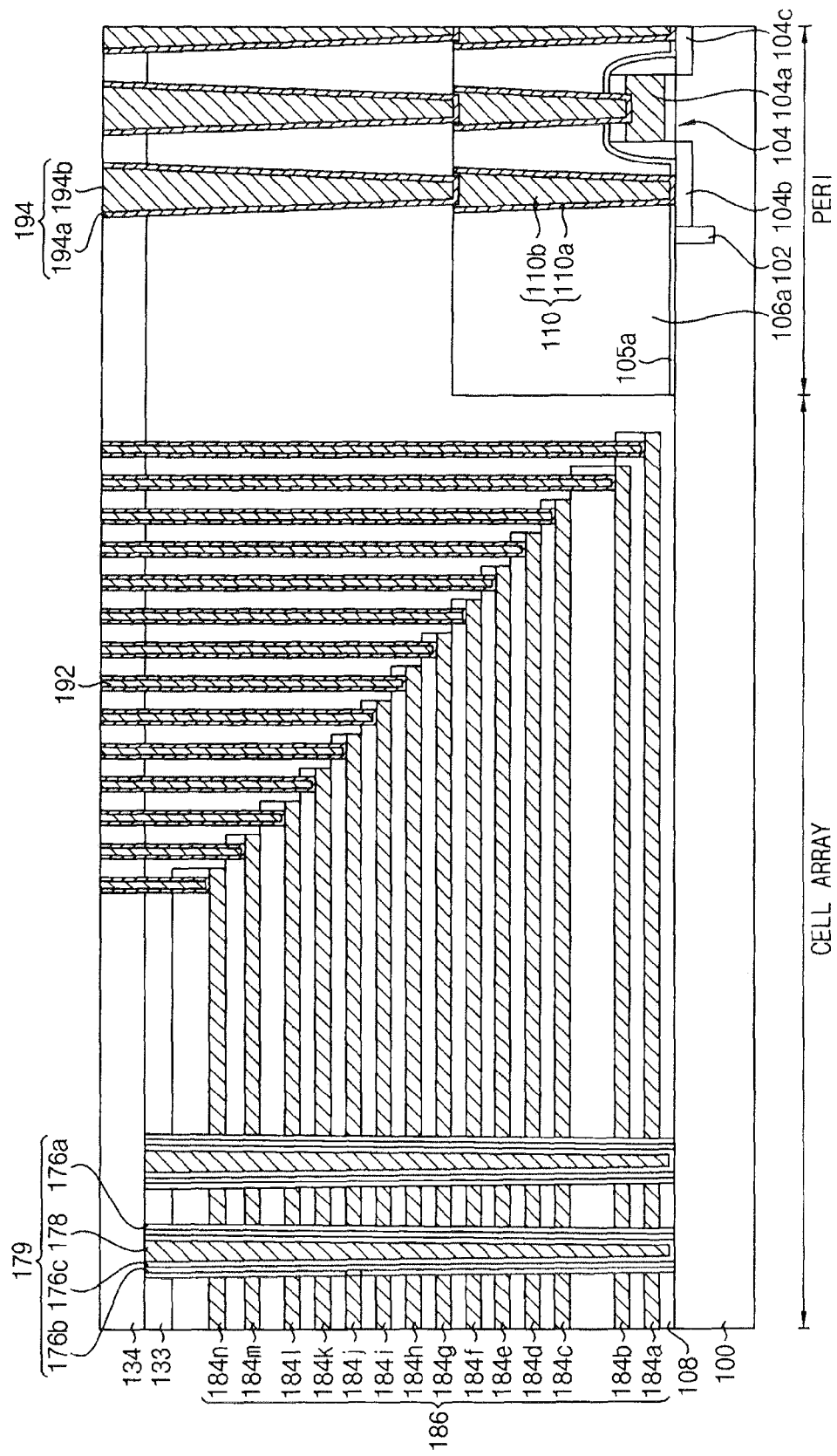
FIG. 14 is a sectional view illustrating a vertical type semiconductor device in accordance with an exemplary embodiment of the inventive concept.

FIG. 14 is a sectional view illustrating a vertical type semiconductor device in accordance with an exemplary embodiment of the inventive concept.

As shown in FIG. 14, the vertical type semiconductor device has a structure substantially identical to the structure of the vertical type semiconductor device described above in connection with FIGS. 8 to 10 except that the shape of the word lines and the word line pads and the connection structure to the word lines are substantially identical to those described above in connection with FIGS. 11 and 12. The word lines shown in FIG. 14 include polysilicon, other than metals.

Figure 15:
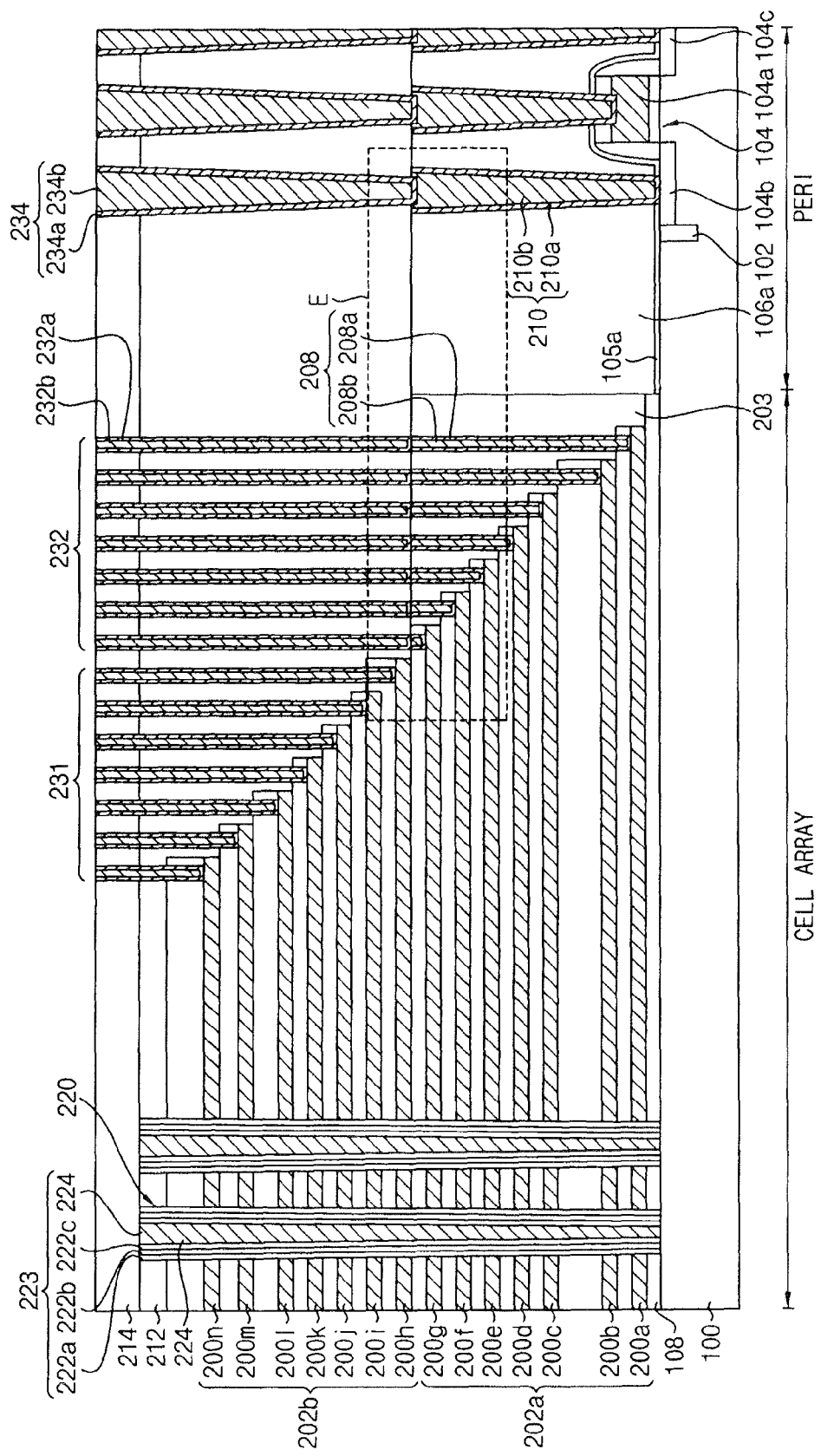
FIG. 15 is a sectional view illustrating a vertical type semiconductor device in accordance with an exemplary embodiment of the inventive concept.
Figure 16:
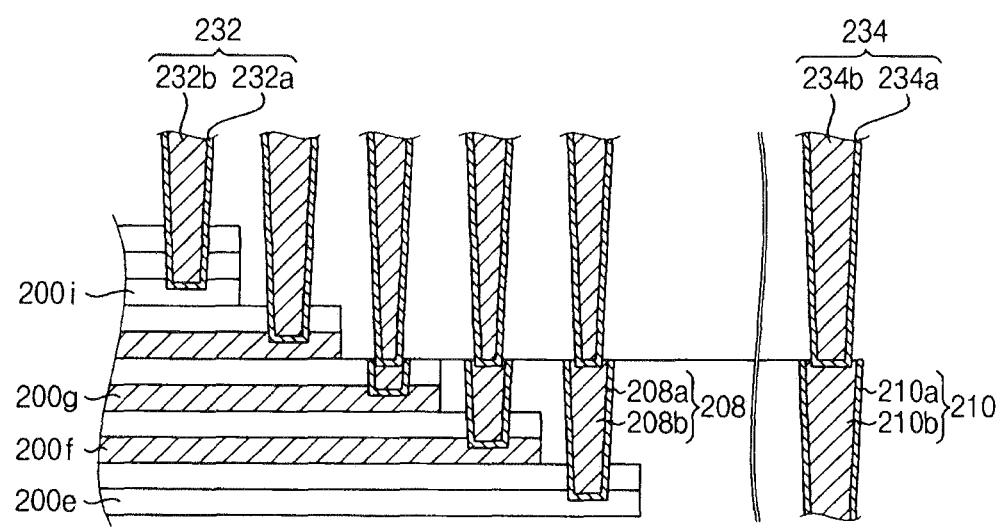
FIG. 16 is an enlarged view of portion 'E' shown in FIG. 15 according to an exemplary embodiment of the present inventive concept.

FIG. 15 is a sectional view illustrating a vertical type semiconductor device in accordance with an exemplary embodiment of the inventive concept. FIG. 16 is an enlarged view of portion 'E' shown in FIG. 15.

Referring to FIG. 15, the MOS transistors 104 constituting the peripheral circuits are provided in the substrate 100 of the peripheral circuit region PERI.

The first insulating interlayer pattern 106a covers the MOS transistors 104. According to an exemplary embodiment of the inventive concept, the upper and lower word lines may be distinguished from each other according to the height of the first insulating interlayer pattern 106a. The word lines located below the top surface of the first insulating interlayer pattern 106a are referred to as the lower word lines 202a, and the word lines located above the top surface of the first insulating interlayer pattern 106a are referred to as the upper word lines 202b. The first insulating interlayer pattern 106a may have a height between about 35% and about 65% of a height of a pillar structure 223 formed in the cell array region. For example, the first insulating interlayer pattern 106a may have a height of about 50% of the height of the pillar structure 223.

First contact plugs 210 pass through the first insulating interlayer pattern 106a and are electrically connected to the gate, the source and the drain of the MOS transistor 104. The first contact plugs 210 may have a height between about 35% and about 65% of the height of the stack structure in which cells are vertically stacked.

Second contact plugs 234 are formed on the first contact plugs 210 while contacting the top surfaces of the first contact plugs 210. The second contact plugs 234 are configured to pass through a third insulating interlayer 212 and an upper insulating interlayer 214. The third insulating interlayer 212 and the upper insulating interlayer 214 cover the cells which are vertically stacked.

In this manner, the first and second contact plugs 210 and 234, which are stacked in the vertical direction, may function as a single contact.

The pillar structures 223 protruding in the vertical direction are provided on the substrate 100 of the cell block area. The pillar structures 223 each may include a channel pattern 224 and a tunnel insulating layer pattern 222c, a charge trap layer pattern 222b and a dielectric layer pattern 222a, which are sequentially stacked in the lateral direction of the channel pattern 222. The pillar structure 223 may have a stack structure substantially identical to the stack structure described above with reference to FIG. 9.

Word lines 202a and 202b are stacked on the substrate 100, with the pillar structures 223 passing through the word lines 202a and 202b. The word lines 202a and 202b are spaced apart from each other by a predetermined interval. The insulating layer patterns 108 are provided between the word lines 202a and 202b and insulate the word lines 202a and 202b from each other. The word lines 202a and 202b prepared in the layered structure may extend while surrounding the pillar structures 223.

The word lines 202a and 202b may include polysilicon. According to an exemplary embodiment of the inventive concept, the word lines 202a and 202b may not include metals.

The word lines 202a and 202b are configured to extend from the cell block area to the connection area. The length of a word line located at a lower position is longer than the length of a word line located at an upper position. Thus, the edge portions of the word lines formed in the connection area form a stepped shape. The top surfaces of the edge portions of the word lines 202a and 202b may function as pad portions. However, as shown in FIG. 15, the word lines 202a and 202b may not extend to the first insulating interlayer pattern 106a covering the peripheral circuit region PERI. Thus, the word lines 202a and 202b may not be bent upward at the first insulating interlayer pattern 106a.

A second insulating interlayer 203 covers the lower word lines 202a. A top surface of the second insulating interlayer 203 is aligned with a top surface of the first insulating interlayer pattern 106a.

Lower contacts 208 are electrically connected to the lower word lines 202a through the second insulating interlayer 203. The lower contacts 208 may have top surfaces having the height substantially identical to the height of the first contact plugs 210 in the peripheral circuit region PERI.

The first contact plugs 210 are substantially simultaneously formed when forming the lower contacts 208. Thus, the lower contacts 208 include metals substantially the same as those of the first contact plugs 210. The lower contacts 208 each may include a barrier metal layer 208a and a metal layer 208b.

The third insulating interlayer 212 and the upper insulating interlayer 214 cover the upper word lines 202b and the second insulating interlayer 203. First and second upper contacts 231 and 232 contact the upper word lines 202b and the lower contacts 208 through the third insulating interlayer 212 and the upper insulating interlayer 214. The first upper contacts 231 directly contact the upper word lines 202b. The second upper contacts 232 contact the lower contacts 208 and are electrically connected to the lower word lines 202a through the lower contacts 208.

The second contact plugs 234 are substantially simultaneously formed when forming the first and second upper contacts 231 and 232. Thus, the first and second upper contacts 231 and 232 include metals substantially the same as those of the second contact plugs 234. The first upper contacts 231 each may include a barrier metal layer 232a and a metal layer 232b, and the second upper contacts 231 and 232 each may include a barrier metal layer 234a and a metal layer 234b.

The contact structure connected to the lower word line 202a has a stack structure in which the lower contact 208 and the second upper contact 232 are stacked in the vertical direction. The lower contact 208 has a stack structure of the third barrier metal layer 208a provided along the sidewall and the bottom surface of the lower contact holes and the third metal layer 208b formed on the third barrier metal layer 208a and fills the lower contact holes. The second upper contact 232 has a stack structure of the fourth barrier metal layer 232a provided along the sidewall and the bottom surface of the upper contact holes and the fourth metal layer 232b formed on the fourth barrier metal layer 232a and fills the upper contact holes. Since the top surface of the lower contact 208 is exposed to the upper contact hole, the fourth barrier metal layer 232a of the second upper contact 232 directly contacts the top surface of the lower contact 208.

A bent sidewall may be formed between the lower contact 208 and the second upper contact 232 of the contact structure.

In the vertical type semiconductor device according to an exemplary embodiment of the inventive concept, the height of each contact plug is smaller compared with the pillar structure, and thus, the substrate 100 may be prevented from being accidentally etched, insufficiently exposed, or shorted when the contacts are formed in the peripheral circuits.

FIGS. 17A to 17G are sectional views illustrating a method of manufacturing the vertical type semiconductor device shown in FIG. 15 according to an exemplary embodiment of the present inventive concept.

The MOS transistor 104 for the peripheral circuits, the etch stop layer 105 and the first insulating interlayer 106 are formed by performing the process described above with reference to FIG. 4A.

The upper and lower word lines may be distinguished from each other according to the height of the first insulating interlayer 106. The first insulating interlayer 106 may have a height between about 35% and about 60% of a height of the pillar structure formed in the cell array region. For example, the first insulating interlayer 106 may have a height of about 50% of the height of the pillar structure.

Figure 17A:
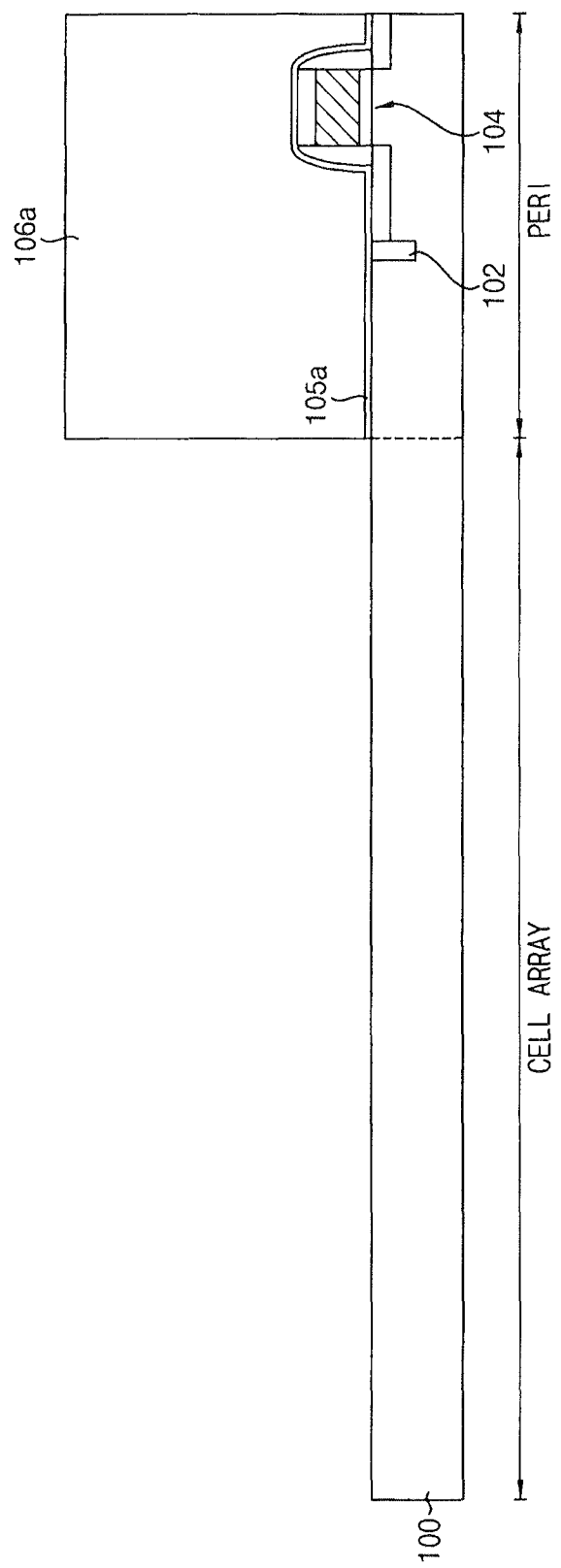

Referring to FIG. 17A, the first insulating interlayer 106 formed in the cell array region is etched forming the first insulating interlayer pattern 106a. Then, the etch stop layer is removed to expose the substrate 100 of the cell array region, thereby forming the etch stop layer pattern 105a. Thus, due to the first insulating interlayer pattern 106a, a step difference may be formed between the cell array region and the peripheral circuit region PERI.

Figure 17B:
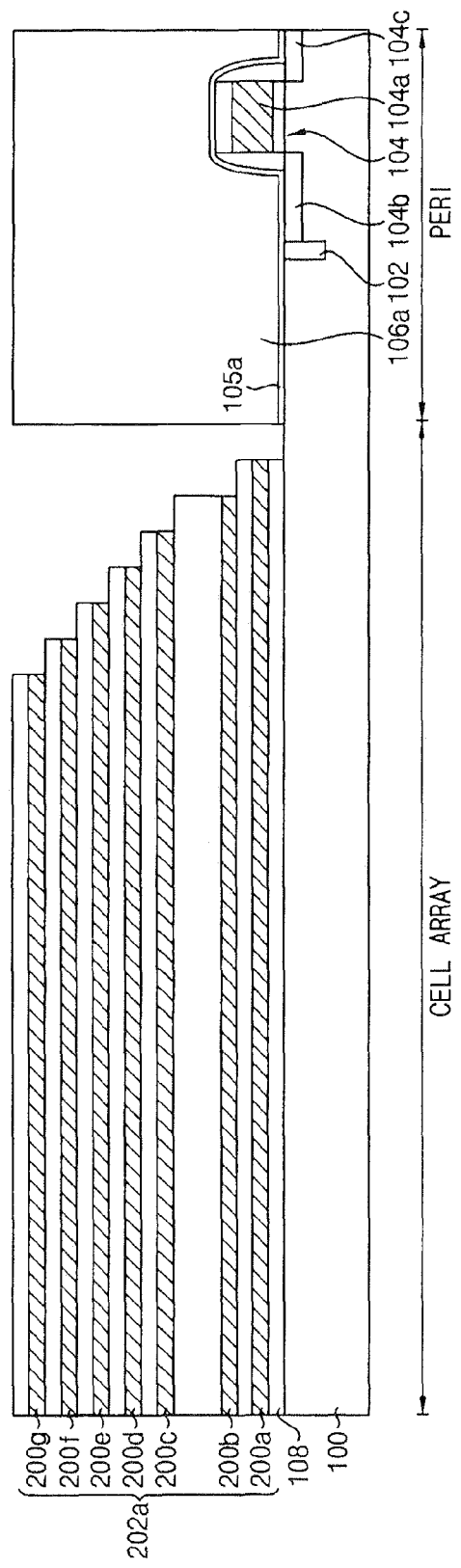

Referring to FIG. 17B, insulating layers and polysilicon layers are repeatedly deposited on the substrate 100 and the first insulating interlayer pattern 106a. The insulating layers and the polysilicon layers may be deposited until the insulating layers and the polysilicon layers formed on the top surface of the substrate 100 have substantially the same height as the top surface of the first insulating interlayer pattern 106a. In the deposition process, the polysilicon layers used for lower word lines may be deposited.

Then, edge portions of the polysilicon layers and the insulating layers are etched forming the lower word lines 202a and the insulating layer patterns 108 having step-shaped edge portions.

The lower word lines 202a and the insulating layer patterns 108 may not extend to the first insulating interlayer pattern 106a covering the peripheral circuit region PERI. The uppermost layer of the lower word lines 202a and the insulating layer patterns 108 may be aligned with the top surface of the first insulating interlayer pattern 106a.

Figure 17C:
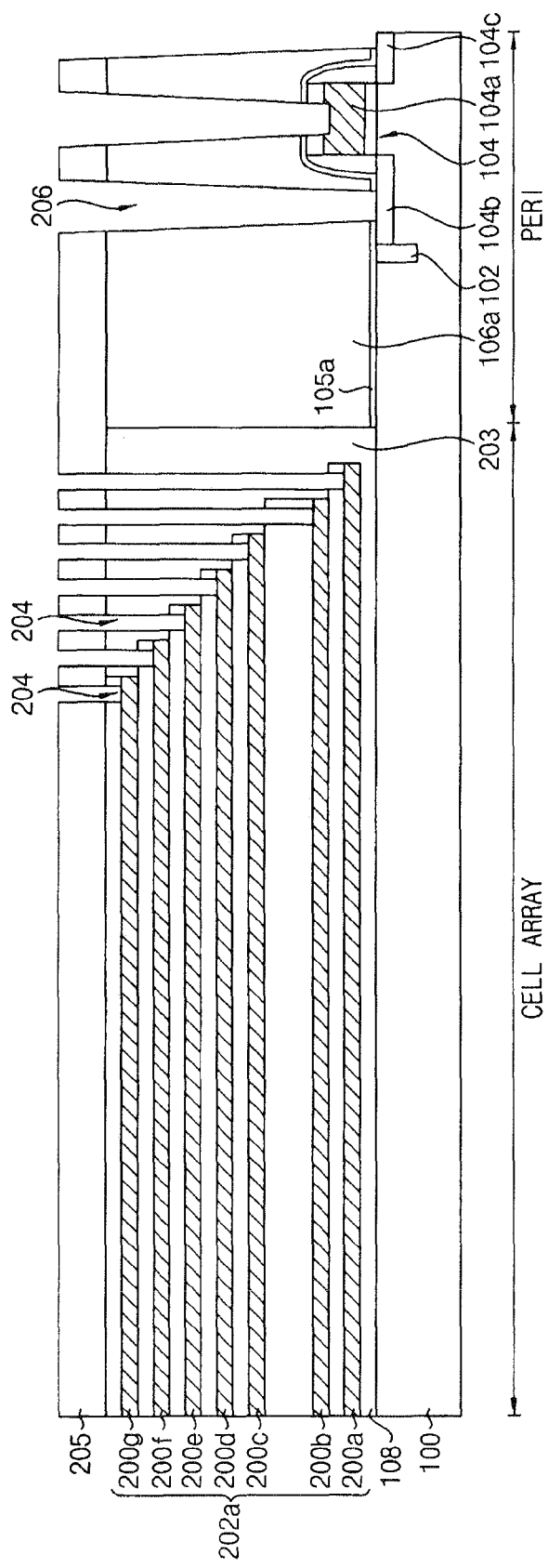

Referring to FIG. 17C, the second insulating interlayer 203 covers the lower word lines 202a and the insulating layer patterns 108. Then, the second insulating interlayer 203 is polished and aligned with the first insulating interlayer pattern 106a.

Thereafter, a first etching mask pattern 205 is formed on the second insulating interlayer 203. The first etching mask pattern 205 may be a photoresist pattern formed through a photo process. The first etching mask pattern 205 is used to form contact holes in the top surface of the lower word lines 202a and in the gate, source and drain of the MOS transistors for the peripheral circuits.

The second insulating interlayer 203 is etched by using the first etching mask pattern 205 to thus form the first contact holes 204 exposing edge portions of the lower word lines 202a. The second contact holes 206 are formed in the peripheral circuit region PERI through an etching process.

Figure 17D:
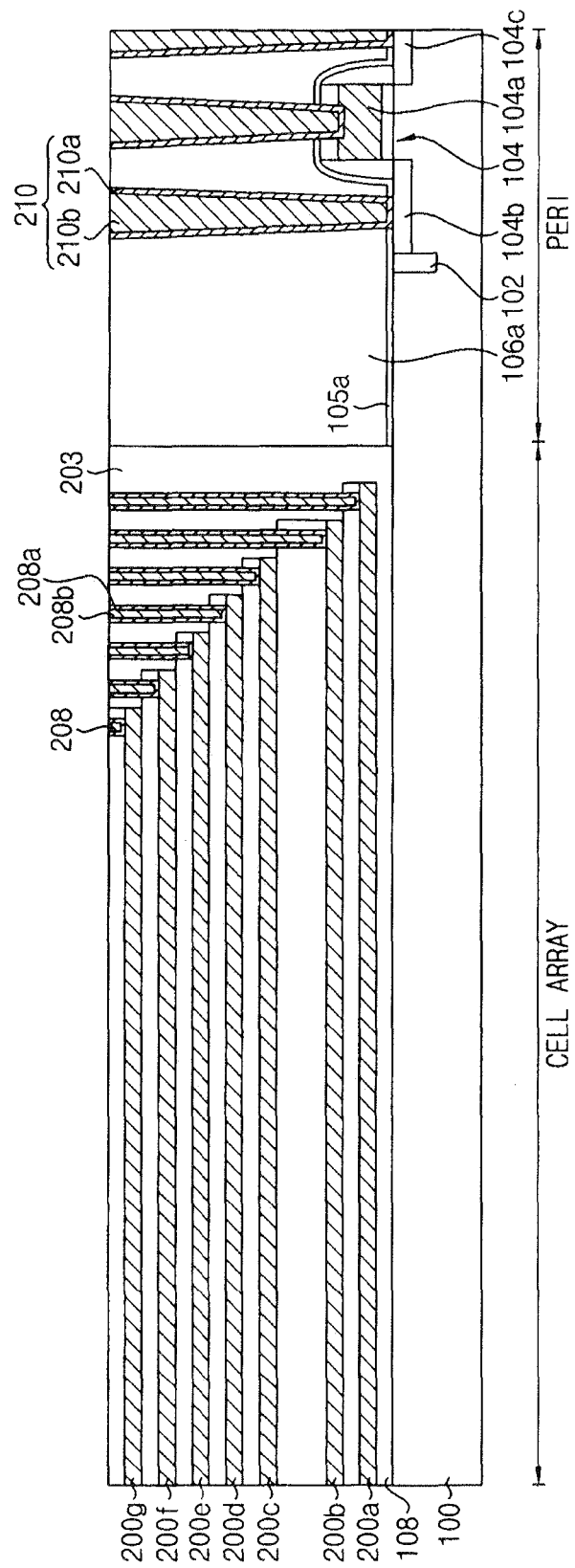

Referring to FIG. 17D, conductive materials are formed in the first and second contact holes 204 and 206 to form the lower contacts 208 in the cell array region and the first contact plugs 210 in the peripheral circuit region PERI. Since the lower contact plugs 208 and the first contact plugs 210 are formed through substantially the same deposition process, the lower contact plugs 208 and the first contact plugs 210 include substantially the same materials. The lower contact plugs 208 each may include a barrier metal layer pattern 208a and a metal layer pattern 208b, and the first contact plugs 210 each may include a barrier metal layer pattern 210a and a metal layer pattern 210b.

The barrier metal layer is conformally formed along the surfaces of the first and second contact holes 204 and 206. Then, the metal layer is formed on the barrier metal layer to thus fill the first and second contact holes 204 and 206. Thereafter, the metal layer and the barrier meal layer are subjected to a chemical mechanical polishing process, exposing the top surfaces of the second insulating interlayer 203 and the first insulating interlayer pattern 106a. Examples of materials used for the barrier metal layer may include titanium, titanium nitride, tantalum, and/or tantalum nitride. The materials may be used alone or in a combination thereof. Examples of materials used for the metal layer may include tungsten, copper, and/or aluminum. The materials may be used alone or in a combination thereof. Therefore, the lower contacts 208 directly contacting the lower word lines 202a and the first contact plugs 210 directly connected to the transistor for the peripheral circuit can be substantially simultaneously formed.

Figure 17E:
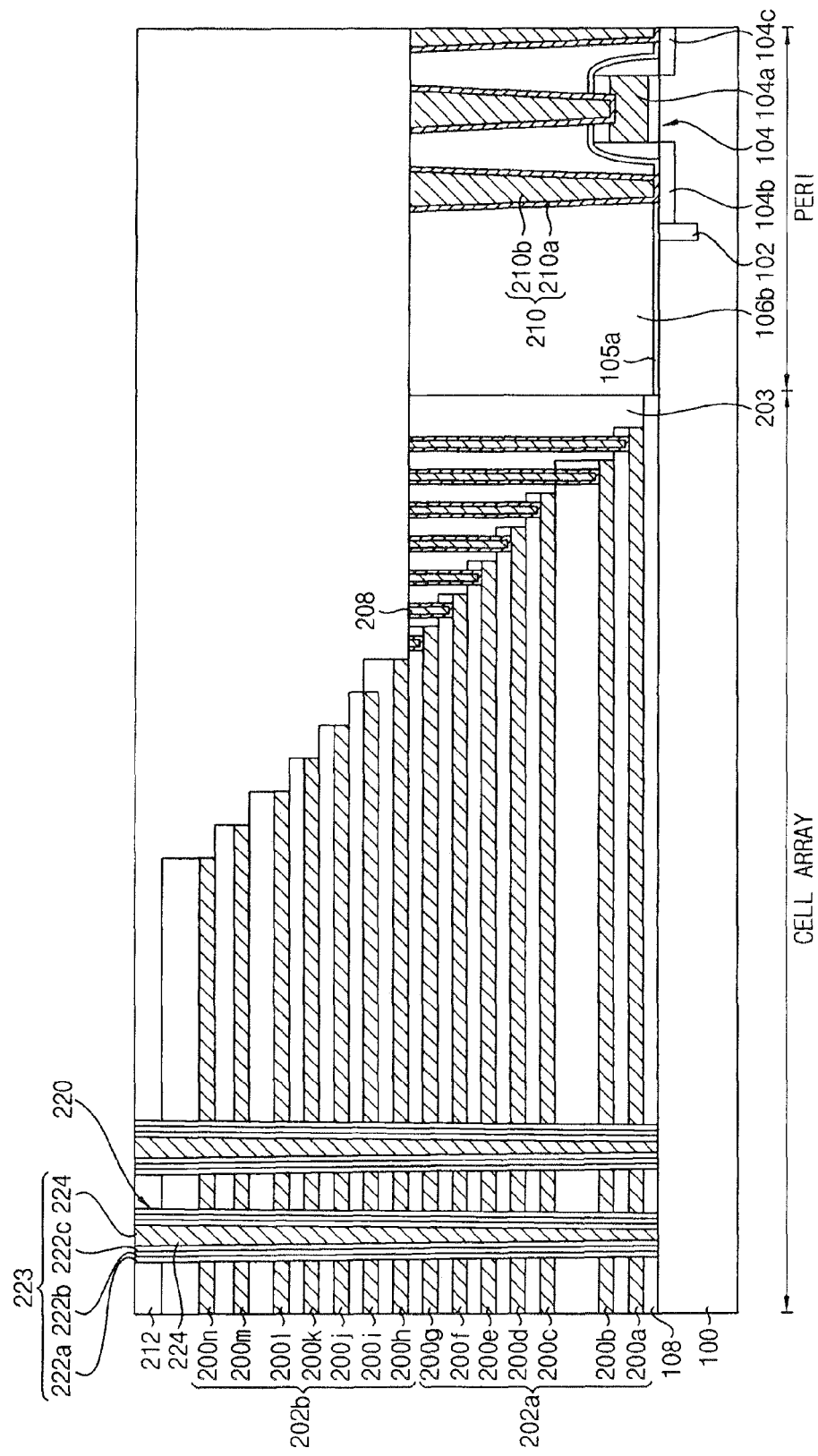

Referring to FIG. 17E, the upper polysilicon layers and the insulating layers are repeatedly deposited on the lower stack structure, the second insulating interlayer 203 and the first insulating interlayer pattern 106a. The polysilicon layers are used to form the upper word lines through a subsequent process. Then, the upper polysilicon layers, the lower word lines 202a and the insulating layer patterns 108, which are formed in the cell block region, are etched forming the channel holes 220 exposing the surface of the substrate 100.

Then, the dielectric layer, the charge trap layer and the tunnel insulating layer are formed along the sidewall of the channel holes 220 and the surface of the substrate 100. Thereafter, the dielectric layer, the charge trap layer and the tunnel insulating layer formed at the bottom surface of the channel holes are removed through an anisotropic etching process. Thus, the dielectric layer 222a, the charge trap layer pattern 222b, and the tunnel insulating layer pattern 222c having a spacer shape are formed at the sidewall of the channel holes. Therefore, the pillar structures 223 can be formed.

According to an exemplary embodiment of the inventive concept, the pillar structures are formed after the polysilicon layers functioning as the word lines are formed. Thus, the vertical type memory cells can be manufactured.

Subsequently, edge portions of the insulating layers and the upper polysilicon layers are etched forming the insulating layer patterns 108 and the upper word lines 202b having step-shaped edge portions.

Then, the upper word lines 202b, the second insulating interlayer 203 and the first insulating interlayer pattern 106a are planarized forming the third insulating interlayer 212.

Referring to FIG. 17F, the upper insulating interlayer 214 is formed on the third insulating interlayer 212. The second etching mask pattern 226 is formed on the upper insulating interlayer 214. The second etching mask pattern 226 may be a photoresist pattern formed through a photo process.

The second etching mask pattern 226 is used to form the third and fourth contact holes 230a and 230b in the upper word lines 202b, the lower contact 208 and the first contact plug 210.

The upper insulating interlayer 214 and the third insulating interlayer 212 are etched by using the second etching mask pattern 226 to form the third contact holes 230a exposing edge portions of the upper word lines. The polysilicon included in the upper word lines 202b is exposed to the third contact holes 230a. Further, the metal layer included in the lower contact 208 is exposed to the third contact holes 230a. The fourth contact holes 230b exposing the first contact plugs 210 are formed through an etching process. The metal layer included in the first contact plug 210 is exposed to the fourth contact holes 230b.

Since the lower contacts 208 and the first contact plugs 210 are formed in a previous process, the contact holes formed through the etching process may not undergo a great change in depth. Thus, the contact holes exposing the lower contacts 208 and the first contact plugs 210 can be substantially simultaneously formed when forming the contact holes exposing the upper word lines 202b.

According to an exemplary embodiment of the inventive concept, the third contact holes exposing the upper word lines 202b are formed by performing a photolithography process one time. However, when the number of the word lines is increased, the third contact holes may be formed by performing the photolithography process at least two times. Even if the photolithography process is performed at least two times, the third contact holes 230a, which are formed in the cell array region, and the fourth contact holes 230b, which are formed in the peripheral circuit region PERI, can be substantially simultaneously formed. Thus, an additional photolithography process to form the fourth contact holes 230b in the peripheral circuit region PERI need not be performed.

Figure 17G:
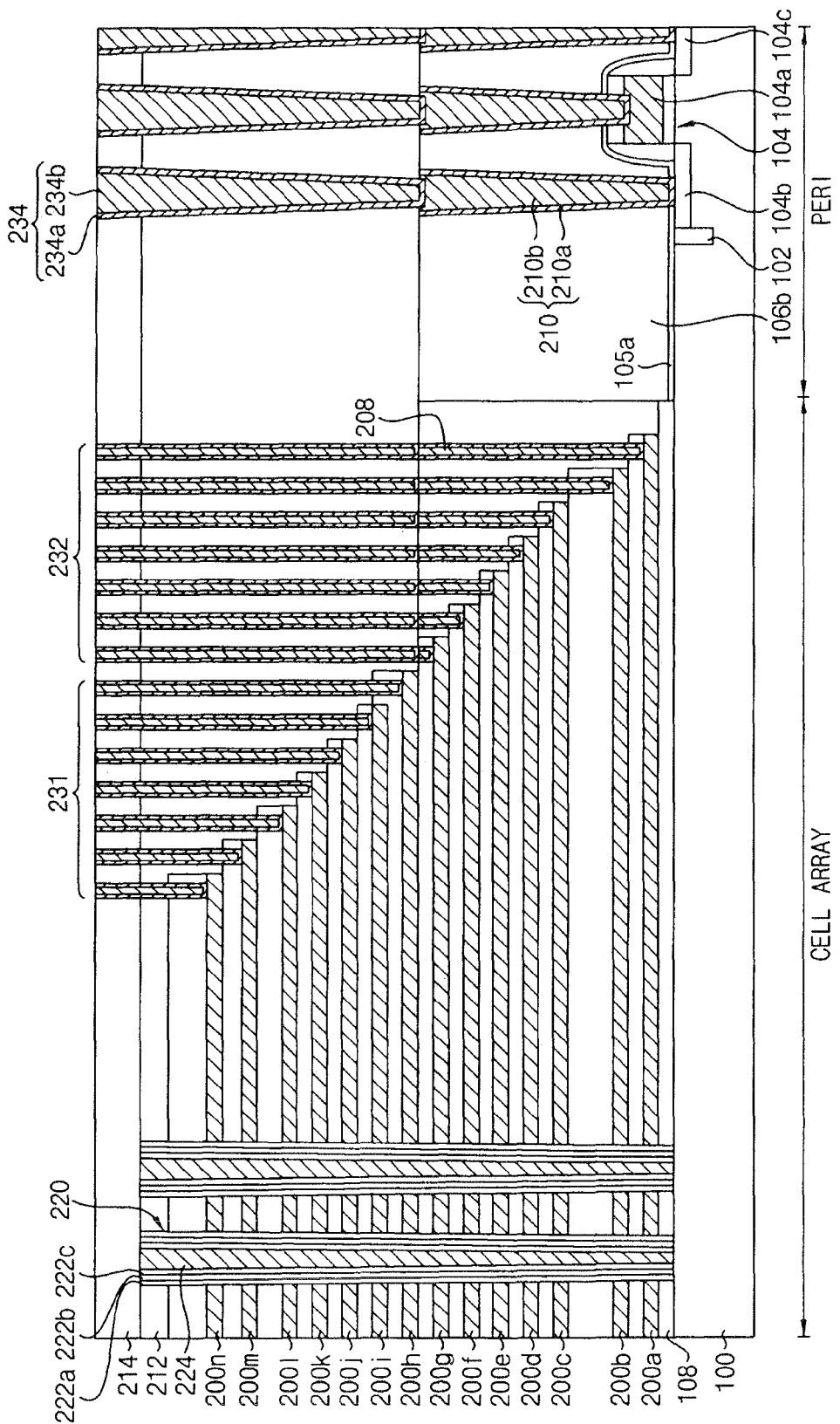

Referring to FIG. 17G, conductive materials are formed in the third and fourth contact holes 230a and 230b. Therefore, the first upper contacts 231 connected to the upper word lines, the second upper connects 232 electrically connected to the lower word lines, and the second contact plugs 234 electrically connected to the peripheral transistors can be formed.

Since the first upper contacts 231, the second upper connects 232 and the second contact plugs 234 are formed through substantially the same deposition process, the first upper contacts 231, the second upper connects 232 and the second contact plugs 234 may include substantially the same material. The first upper contacts 231, the second upper connects 232 and the second contact plugs 234 each may include substantially the same barrier metal layer pattern and substantially the same metal layer pattern.

Therefore, the substrate 100 may be prevented from being etched due to over etch or prevented from failing to be exposed due to insufficient etch, and a short circuit may be prevented from occurring at upper portions of the contacts when the contacts are formed in the peripheral circuits.

Figure 18:
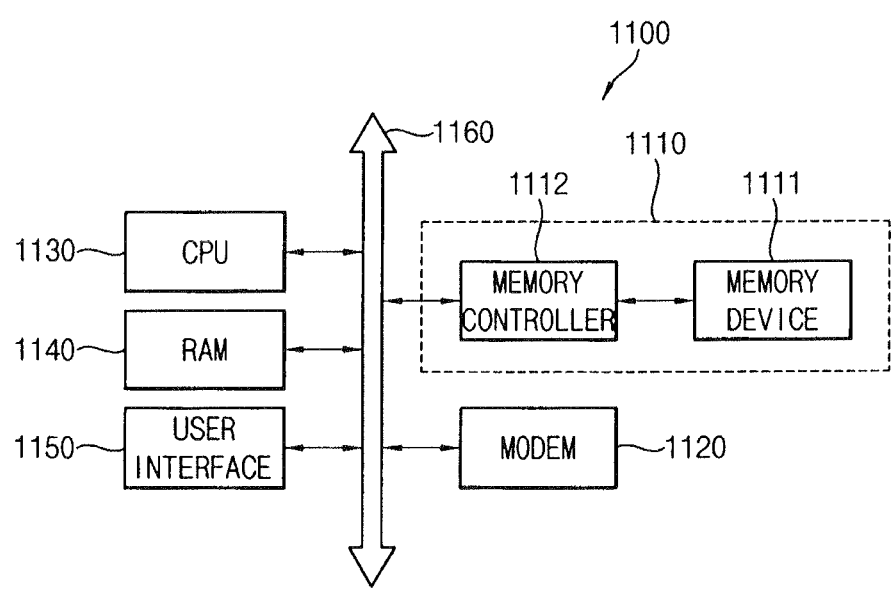
FIG. 18 is a block diagram illustrating an information processing system in accordance with an exemplary embodiment of the inventive concept.

FIG. 18 is a block diagram illustrating an information processing system in accordance with an exemplary embodiment of the inventive concept.

Referring to FIG. 18, the information processing system 1100 may include a vertical type non-volatile memory device 1111 in accordance with an exemplary embodiment of the inventive concept.

The information processing system 1100 includes a memory system 1110, a modem 1120, a central processing unit (CPU) 1130, a random access memory (RAM) 1140 and a user interface 1150, which are electrically connected to a system bus 1160. Data processed by the CPU 1130 or data input from the outside may be stored in the memory system 1110. The memory system 1110 includes the vertical type non-volatile memory device 1111 in accordance with an exemplary embodiment of the inventive concept, and thus, the information processing system 1100 can stably store the mass-storage data therein.

The information processing system 1100 in accordance with exemplary embodiments of the inventive concept may further include an application chipset, a camera image processor (CIS), a mobile dynamic RAM (DRAM), and/or an input/output device.

As described above, according to exemplary embodiments of the inventive concept, the vertical type non-volatile memory device including the stacked wires can be provided through a simple process. The vertical type non-volatile memory device may be applicable to various electronic apparatuses and communication apparatuses.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:
1. A vertical type semiconductor device, comprising:
 a pillar structure protruding in a vertical direction from a surface of a substrate in a cell array region and including a channel pattern;
 lower word lines surrounding the pillar structure formed in the cell array region, wherein the lower word lines are stacked and spaced apart from each other in the vertical direction;
 upper word lines surrounding the pillar structure formed in the cell array region, wherein the upper word lines are disposed over the lower word lines;

a MOS transistor on the substrate of a peripheral circuit region;
a first insulating interlayer pattern on the substrate of the peripheral circuit region to cover the MOS transistor;
a second insulating interlayer pattern on the substrate of the cell array region to cover the lower word lines, wherein top surfaces of the first and second insulating interlayer patterns are substantially coplanar with each other;
a third insulating interlayer pattern directly on the first and second insulating interlayer patterns to cover the upper word lines;
a first contact plug passing through the first insulating interlayer pattern;
a second contact plug passing through the second insulating interlayer pattern; and
a third contact plug directly contacting a top surface of the first contact plug, and passing through the third insulating interlayer pattern, wherein a bottom surface of the third contact plug is lower than a top surface of an upper most word line of the upper word lines.

2. The vertical type semiconductor device of claim 1, wherein the first contact plug includes a plurality of first contact plugs, and the first contact plugs are electrically connected to a source region, a drain region and a gate of the MOS transistor, respectively.

3. The vertical type semiconductor device of claim 1, wherein the second contact plug includes a plurality of second contact plugs, and the second contact plugs contact the lower word lines, respectively.

4. The vertical type semiconductor device of claim 1, wherein the first and second contact plugs include substantially the same material.

5. The vertical type semiconductor device of claim 1, wherein the top surfaces of the first and second contact plugs are substantially coplanar with each other.

6. The vertical type semiconductor device of claim 1, wherein top surfaces of the first and second insulating interlayer patterns are substantially coplanar with each other.

7. The vertical type semiconductor device of claim 1, further comprising fourth contact plugs directly contacting the upper word lines and top surfaces of the second contact plugs, respectively, and passing through the third insulating interlayer pattern.

8. The vertical type semiconductor device of claim 7, wherein the third and fourth contact plugs include substantially the same material.

9. The vertical type semiconductor device of claim 7, wherein top surfaces of the third and fourth contact plugs are substantially coplanar with each other.

10. The vertical type semiconductor device of claim 1, wherein a top surface of the third insulating interlayer pattern is higher than a top surface of the pillar structure.

11. The vertical type semiconductor device of claim 1, wherein a sidewall of the pillar structure is not bent in a horizontal direction.

12. The vertical type semiconductor device of claim 1, wherein the pillar structure further include a tunnel insulating layer pattern, a charge trap layer pattern and a dielectric layer pattern which are stacked on the channel pattern in a horizontal direction.

13. The vertical type semiconductor device of claim 1, wherein the first, second and third insulating interlayer patterns include first, second and third insulating materials, respectively, and the first, second and third insulating materials are formed by different deposition processes, respectively.

14. A vertical type semiconductor device, comprising:
a pillar structure protruding in a vertical direction from a surface of a substrate in a cell array region and including a channel pattern, a tunnel insulating layer pattern, a charge trap pattern and a dielectric layer pattern which are stacked in a horizontal direction;
lower word lines surrounding the pillar structure, wherein the lower word lines are stacked and spaced apart from each other in the vertical direction;
upper word lines surrounding the pillar structure, wherein the upper word lines are disposed over the lower word lines;
a first insulating interlayer pattern provided on the substrate in a peripheral circuit region, the first insulating interlayer pattern having a top surface positioned between the upper and lower word lines;
a second insulating interlayer pattern on the substrate of the cell array region to cover the lower word lines, wherein top surfaces of the first and second insulating interlayer patterns are substantially coplanar with each other;
a third insulating interlayer pattern directly on the first and second insulating interlayer patterns to cover the upper word lines;
a first contact plug contacting the surface of the substrate in the peripheral circuit region, and passing through the first insulating interlayer pattern;
second contact plugs contacting the lower word lines, and passing through the second insulating interlayer pattern;
a third contact plug directly contacting a top surface of the first contact plug, and passing through the third insulating interlayer pattern, wherein a bottom surface of the third contact plug is lower than a top surface of an upper most word line of the upper word lines; and
fourth contact plugs directly contacting the upper word lines and top surfaces of the second contact plugs, respectively, and passing through the third insulating interlayer pattern.

15. The vertical type semiconductor device of claim 14, wherein the first insulating interlayer covers a MOS transistor on the substrate in the peripheral circuit region.

16. The vertical type semiconductor device of claim 14, wherein the first and second contact plugs include substantially the same material.

17. The vertical type semiconductor device of claim 14, wherein the top surfaces of the first and second contact plugs are substantially coplanar with each other.

18. The vertical type semiconductor device of claim 14, wherein the third and fourth contact plugs include substantially the same material.

19. The vertical type semiconductor device of claim 14, wherein a top surface of the third insulating interlayer pattern is higher than a top surface of the pillar structure.

20. The vertical type semiconductor device of claim 14, wherein the first, second and third insulating interlayer patterns include first, second and third insulating materials, respectively, and the first, second and third insulating materials are formed by different deposition processes, respectively.

* * * * *